US012666689B2

(12) United States Patent
Chang et al.

(10) Patent No.: US 12,666,689 B2
(45) Date of Patent: Jun. 23, 2026

(54) LARGE DIMENSION METAL GATE FIELD-EFFECT TRANSISTOR (FET) WITH METAL GATE DUMMY STRUCTURES

(71) Applicant: Taiwan Semiconductor Manufacturing Company, Ltd., Hsinchu (TW)

(72) Inventors: Yu-Chen Chang, Taoyuan (TW); Anhao Cheng, Taichung (TW); Meng-I Kang, Changhua County (TW); Yen-Liang Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 551 days.

(21) Appl. No.: 18/173,818

(22) Filed: Feb. 24, 2023

(65) Prior Publication Data

US 2024/0186397 A1      Jun. 6, 2024

Related U.S. Application Data

(60) Provisional application No. 63/429,547, filed on Dec. 1, 2022.

(51) Int. Cl.
| | |
|---|---|
| *H10D 64/66* | (2025.01) |
| *H10D 30/01* | (2025.01) |

(Continued)

(52) U.S. Cl.
CPC ......... *H10D 64/671* (2025.01); *H10D 30/023* (2025.01); *H10D 64/01318* (2026.01); *H10D 64/01326* (2026.01); *H10D 64/017* (2025.01); *H10D 64/021* (2025.01); *H10D 64/685* (2025.01); *H10D 84/0177* (2025.01); *H10D 84/038* (2025.01); *H10D 84/85* (2025.01)

(58) Field of Classification Search
CPC .... H10D 64/671; H10D 84/85; H10D 64/017; H10D 64/685; H10D 64/021; H10D 30/023; H10D 84/038; H10D 84/0177; H01L 21/28088; H01L 21/28123
See application file for complete search history.

(56) References Cited

U.S. PATENT DOCUMENTS

| | | | | |
|---|---|---|---|---|
| 11,824,057 | B2 * | 11/2023 | Matsumoto | ........ H10D 84/0184 |
| 11,978,781 | B2 * | 5/2024 | Cheng | .................. H10D 64/017 |
| 2021/0083087 | A1 * | 3/2021 | Lin | ........................ H10D 30/60 |

OTHER PUBLICATIONS ip.com Search history (Year: 2026).*

* cited by examiner

*Primary Examiner* — Zandra V Smith
*Assistant Examiner* — Andre C Stevenson
(74) *Attorney, Agent, or Firm* — KILPATRICK TOWNSEND & STOCKTON LLP

(57) ABSTRACT

In accordance with some aspects of the disclosure, a semiconductor structure is provided. The semiconductor structure includes: an active region; and a gate stack disposed on the active region. The gate stack includes: at least one gate dielectric layer disposed on the active region; and a metal gate structure disposed on the at least one gate dielectric layer. The metal gate structure includes: a metal gate layer comprising a first material; and at least one dummy structure disposed in the metal gate layer, the at least one dummy structure extending vertically through an entire thickness of the metal gate structure and comprising a second material. The second material is different from the first material.

20 Claims, 32 Drawing Sheets

(51) Int. Cl.

| | | |
|---|---|---|
| *H10D 64/01* | (2025.01) |
| *H10D 64/68* | (2025.01) |
| *H10D 84/01* | (2026.01) |
| *H10D 84/03* | (2025.01) |
| *H10D 84/85* | (2025.01) |

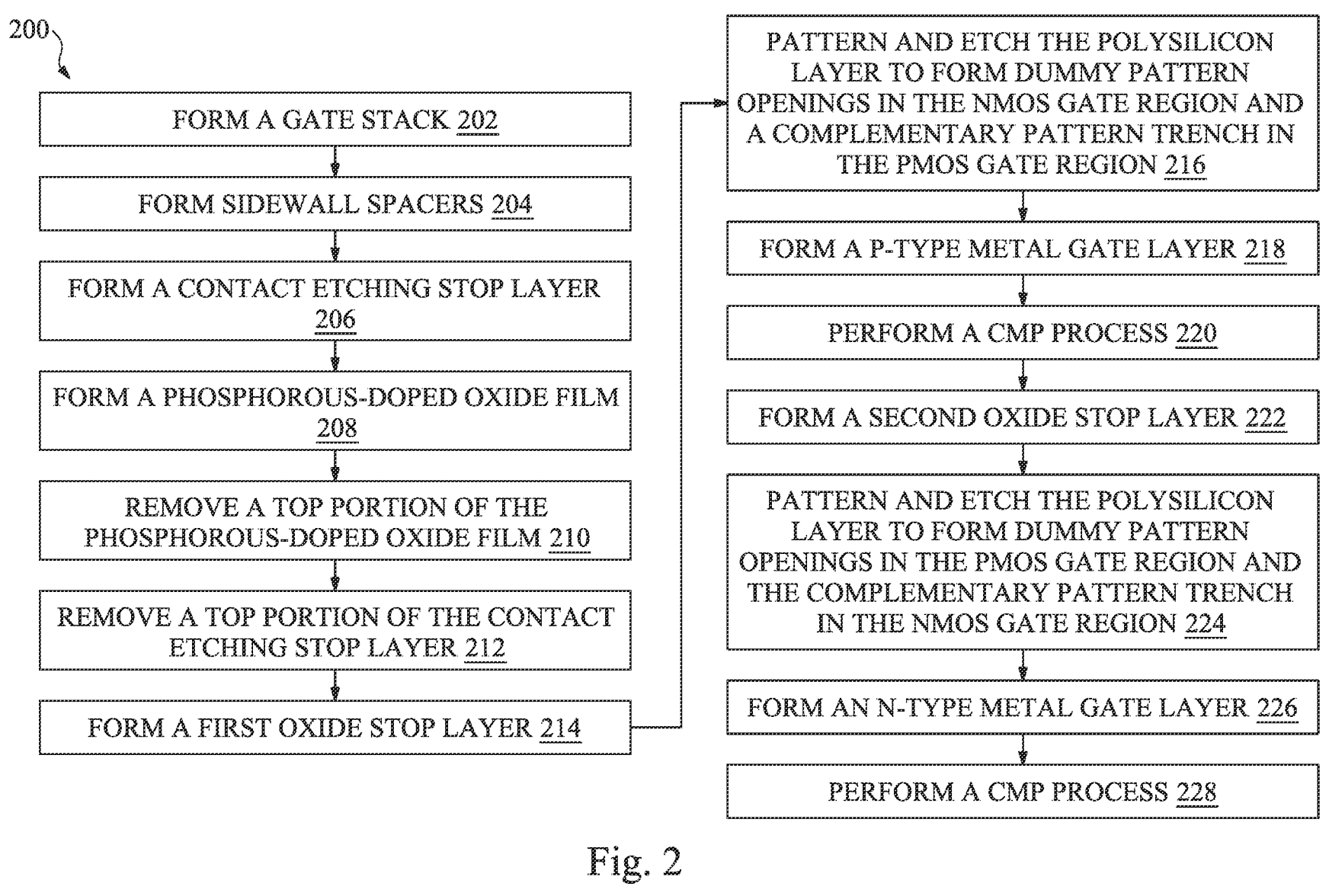

200

FORM A GATE STACK 202

FORM SIDEWALL SPACERS 204

FORM A CONTACT ETCHING STOP LAYER 206

FORM A PHOSPHOROUS-DOPED OXIDE FILM 208

REMOVE A TOP PORTION OF THE PHOSPHOROUS-DOPED OXIDE FILM 210

REMOVE A TOP PORTION OF THE CONTACT ETCHING STOP LAYER 212

FORM A FIRST OXIDE STOP LAYER 214

PATTERN AND ETCH THE POLYSILICON LAYER TO FORM DUMMY PATTERN OPENINGS IN THE NMOS GATE REGION AND A COMPLEMENTARY PATTERN TRENCH IN THE PMOS GATE REGION 216

FORM A P-TYPE METAL GATE LAYER 218

PERFORM A CMP PROCESS 220

FORM A SECOND OXIDE STOP LAYER 222

PATTERN AND ETCH THE POLYSILICON LAYER TO FORM DUMMY PATTERN OPENINGS IN THE PMOS GATE REGION AND THE COMPLEMENTARY PATTERN TRENCH IN THE NMOS GATE REGION 224

FORM AN N-TYPE METAL GATE LAYER 226

PERFORM A CMP PROCESS 228

Fig. 2

NMOS Region

PMOS Region

300n

300p

300

107n

107p 302 308

302 308

102n

102p

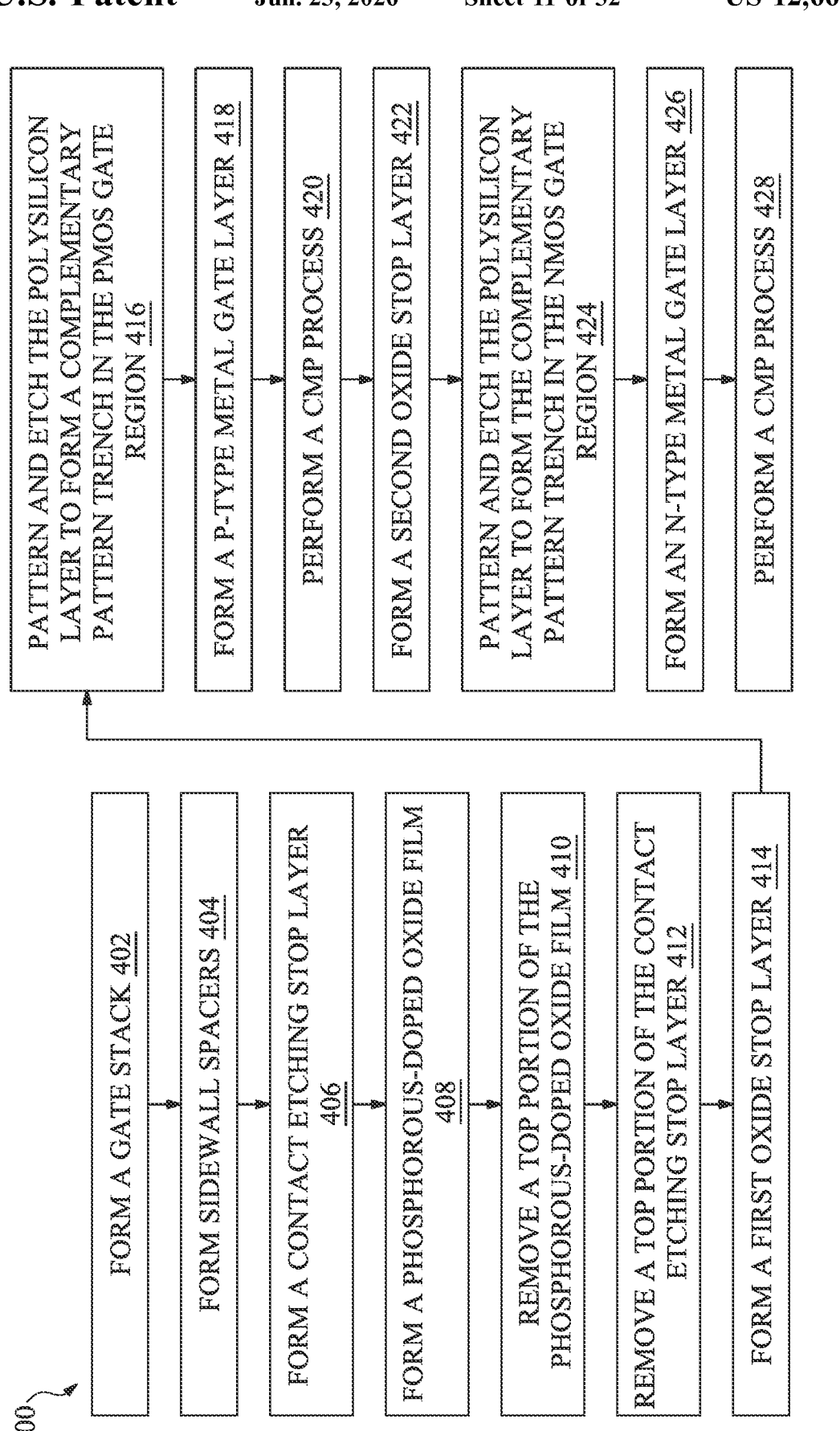

400

FORM A GATE STACK 402

FORM SIDEWALL SPACERS 404

FORM A CONTACT ETCHING STOP LAYER 406

FORM A PHOSPHOROUS-DOPED OXIDE FILM 408

REMOVE A TOP PORTION OF THE PHOSPHOROUS-DOPED OXIDE FILM 410

REMOVE A TOP PORTION OF THE CONTACT ETCHING STOP LAYER 412

FORM A FIRST OXIDE STOP LAYER 414

PATTERN AND ETCH THE POLYSILICON LAYER TO FORM A COMPLEMENTARY PATTERN TRENCH IN THE PMOS GATE REGION 416

FORM A P-TYPE METAL GATE LAYER 418

PERFORM A CMP PROCESS 420

FORM A SECOND OXIDE STOP LAYER 422

PATTERN AND ETCH THE POLYSILICON LAYER TO FORM THE COMPLEMENTARY PATTERN TRENCH IN THE NMOS GATE REGION 424

FORM AN N-TYPE METAL GATE LAYER 426

PERFORM A CMP PROCESS 428

Fig. 4

NMOS Region

500n 308 302 107n

301n

PMOS Region

500p

500

308 302 107p

301p

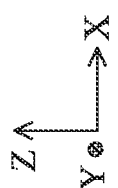
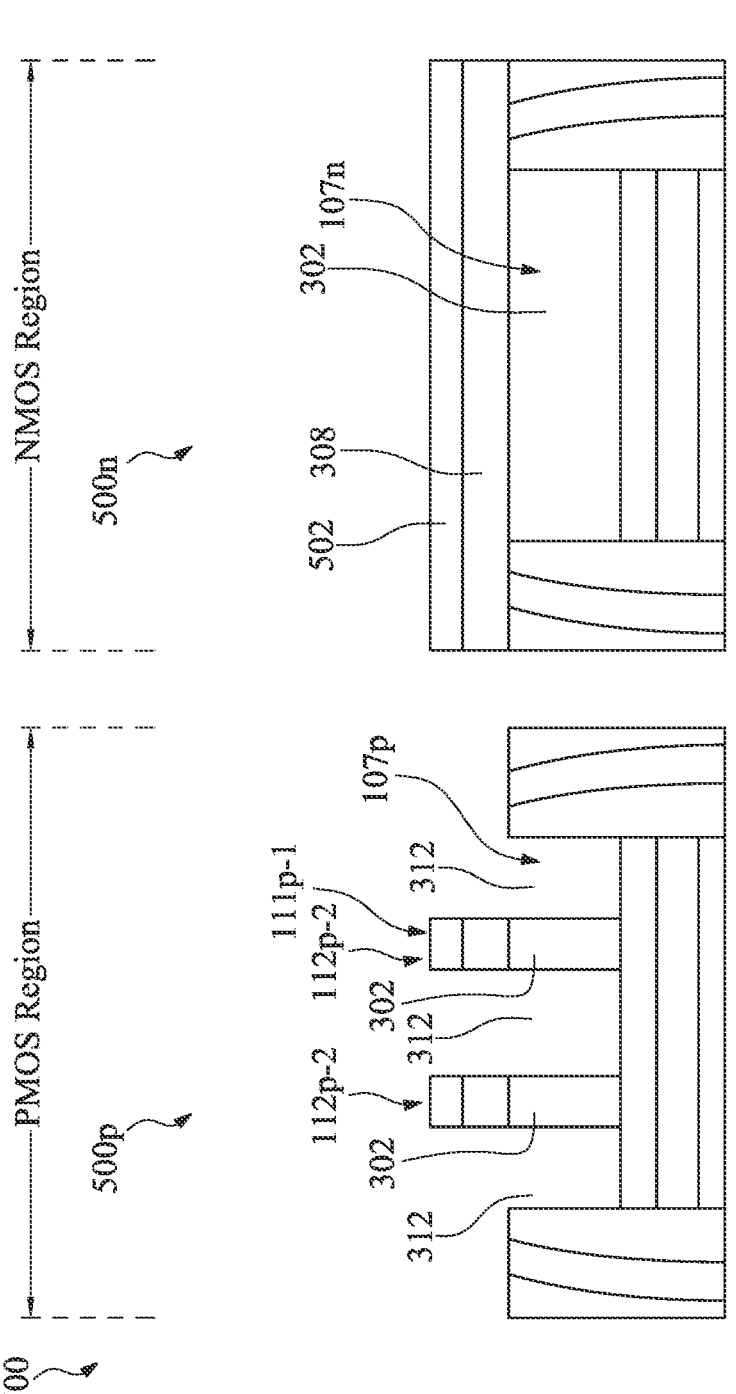
Fig. 5D

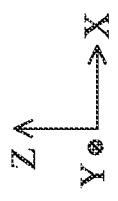
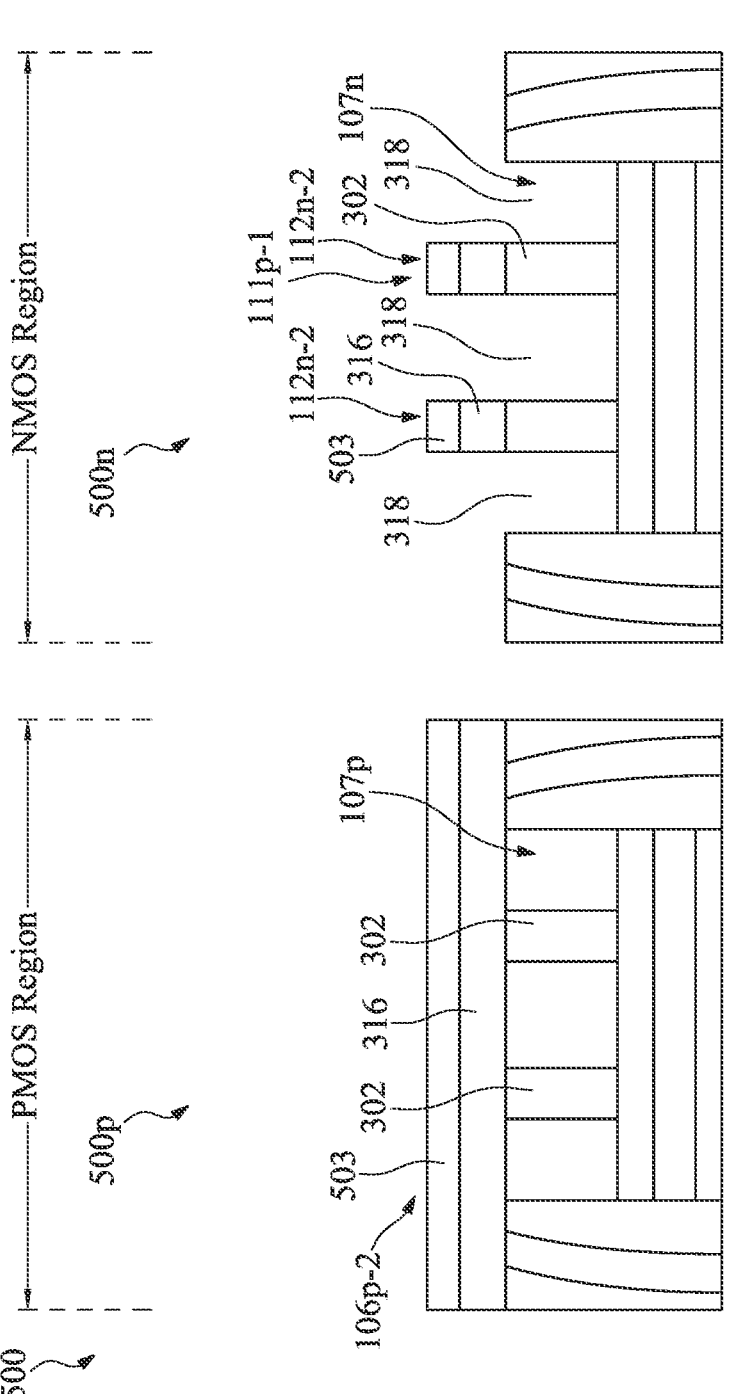
Fig. 5F

Figure 6:
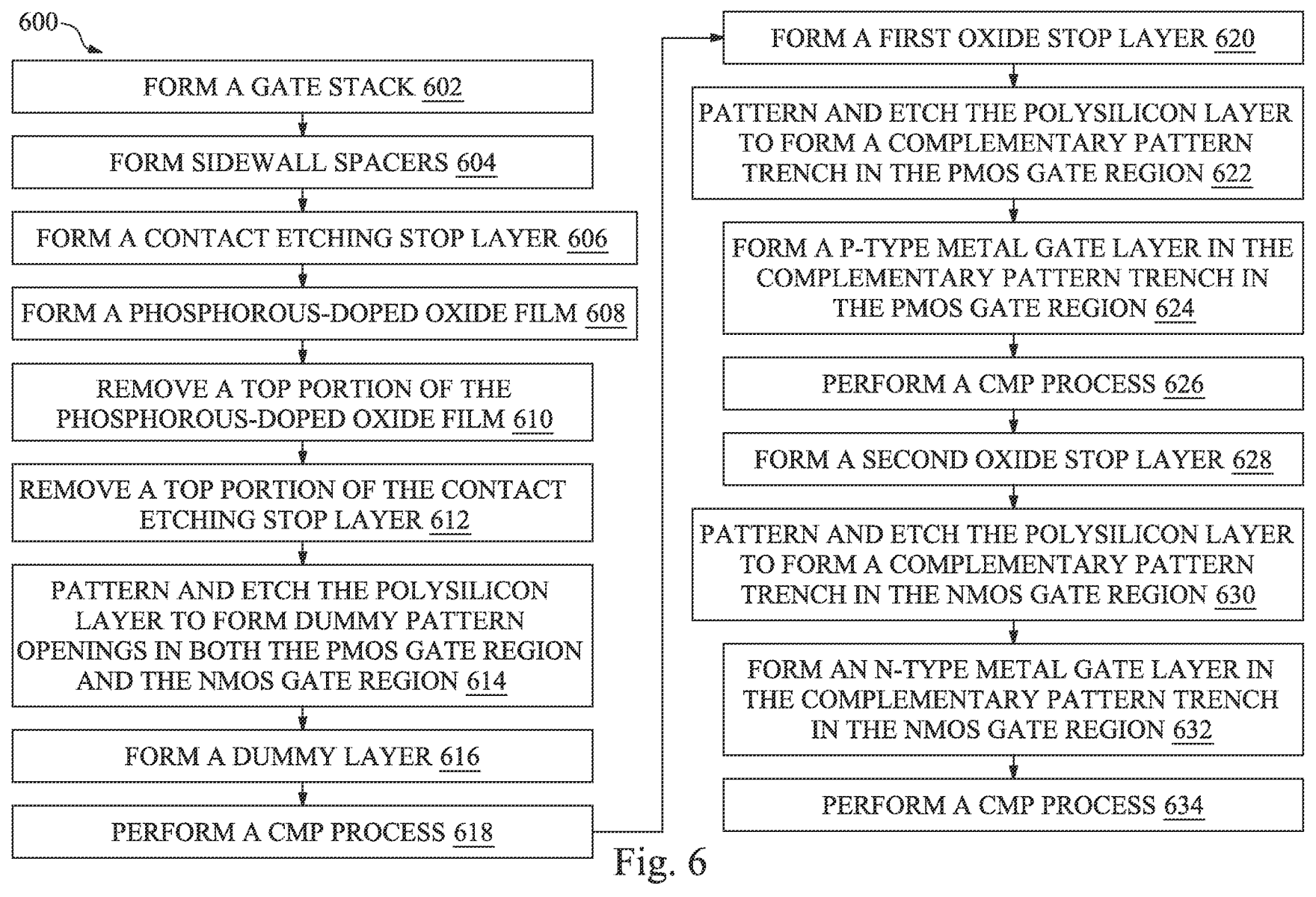

FORM A GATE STACK 602

FORM SIDEWALL SPACERS 604

FORM A CONTACT ETCHING STOP LAYER 606

FORM A PHOSPHOROUS-DOPED OXIDE FILM 608

REMOVE A TOP PORTION OF THE PHOSPHOROUS-DOPED OXIDE FILM 610

REMOVE A TOP PORTION OF THE CONTACT ETCHING STOP LAYER 612

PATTERN AND ETCH THE POLYSILICON LAYER TO FORM DUMMY PATTERN OPENINGS IN BOTH THE PMOS GATE REGION AND THE NMOS GATE REGION 614

FORM A DUMMY LAYER 616

PERFORM A CMP PROCESS 618

FORM A FIRST OXIDE STOP LAYER 620

PATTERN AND ETCH THE POLYSILICON LAYER TO FORM A COMPLEMENTARY PATTERN TRENCH IN THE PMOS GATE REGION 622

FORM A P-TYPE METAL GATE LAYER IN THE COMPLEMENTARY PATTERN TRENCH IN THE PMOS GATE REGION 624

PERFORM A CMP PROCESS 626

FORM A SECOND OXIDE STOP LAYER 628

PATTERN AND ETCH THE POLYSILICON LAYER TO FORM A COMPLEMENTARY PATTERN TRENCH IN THE NMOS GATE REGION 630

FORM AN N-TYPE METAL GATE LAYER IN THE COMPLEMENTARY PATTERN TRENCH IN THE NMOS GATE REGION 632

PERFORM A CMP PROCESS 634

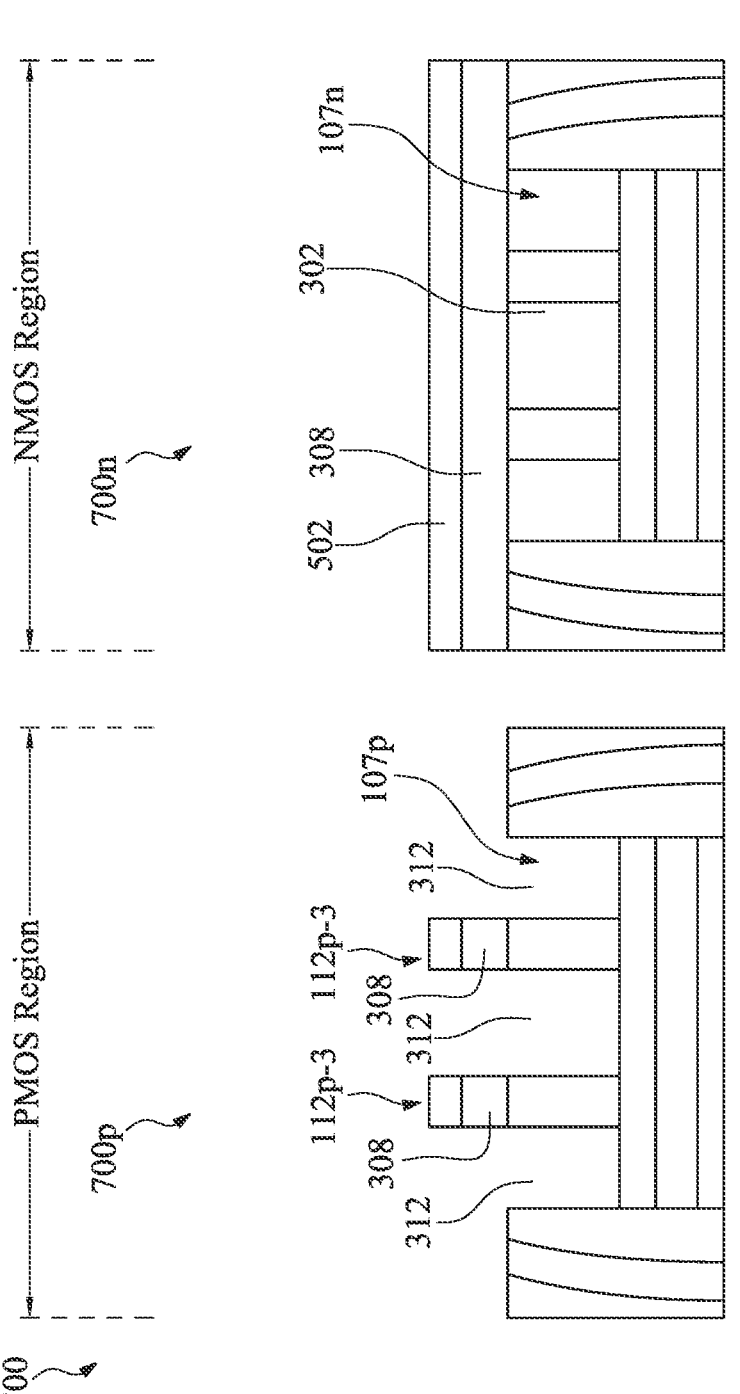
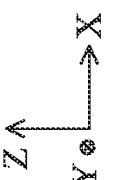
Fig. 7D

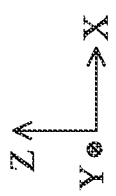
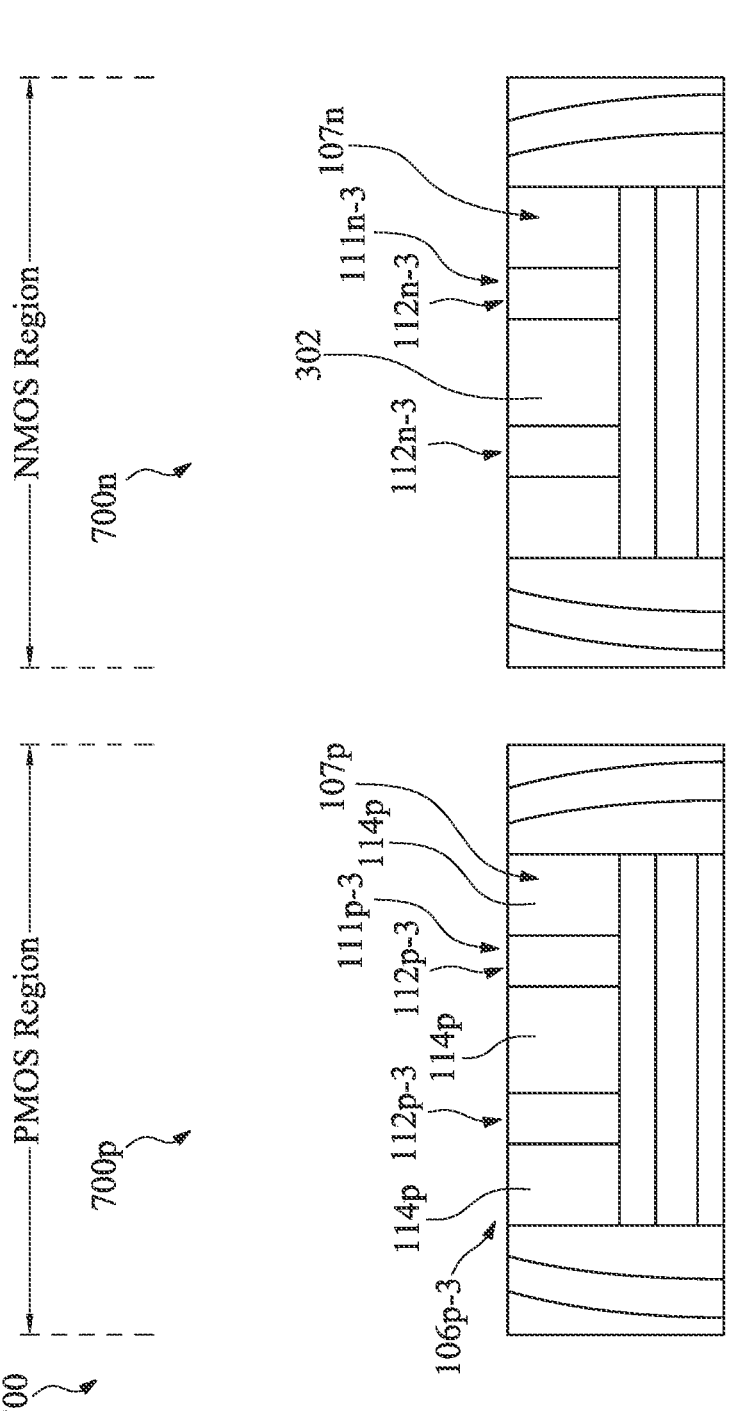
Fig. 7E

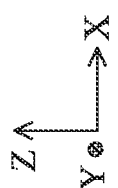
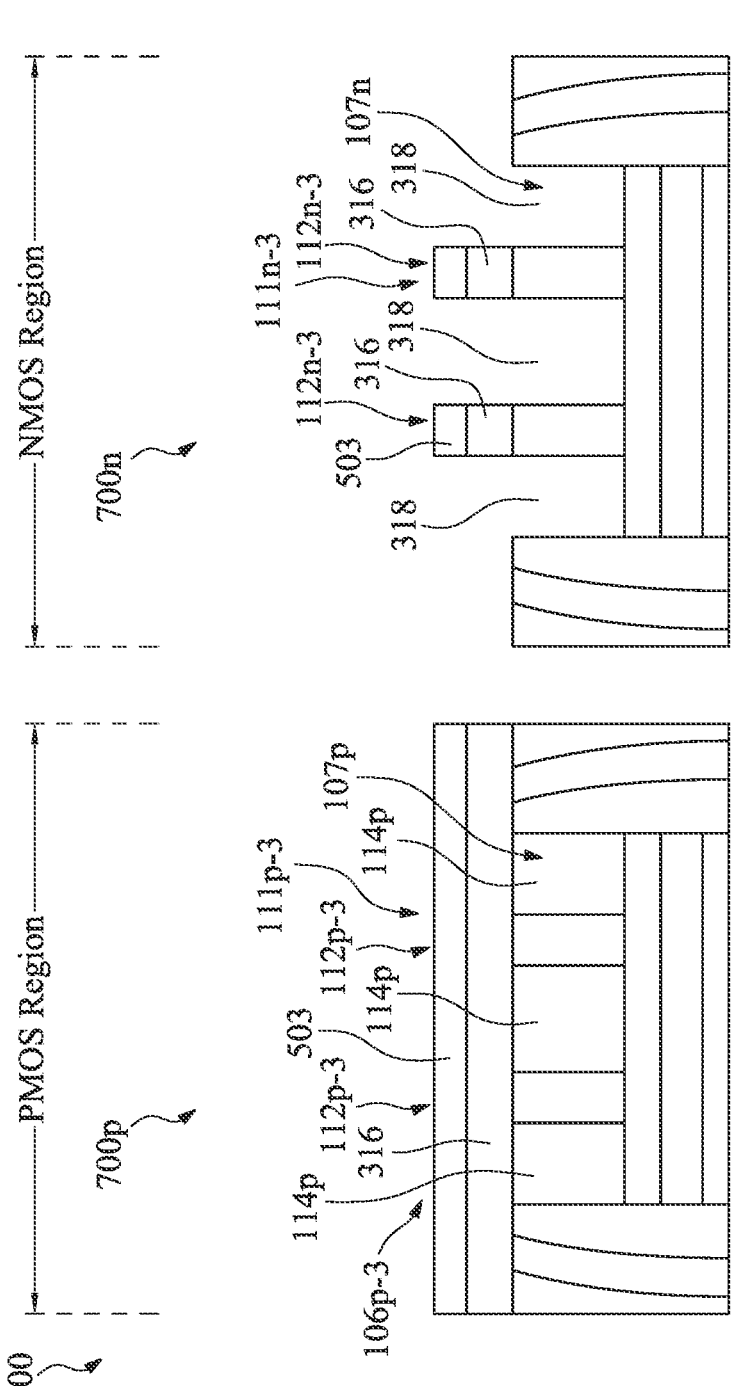
Fig. 7F

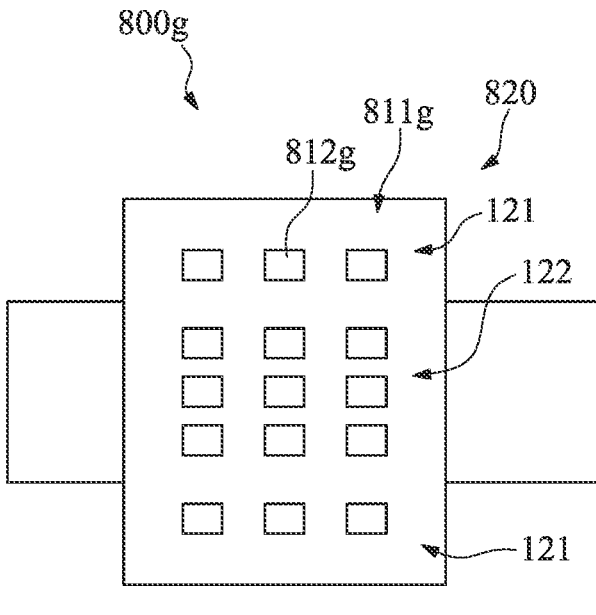
Fig. 8G
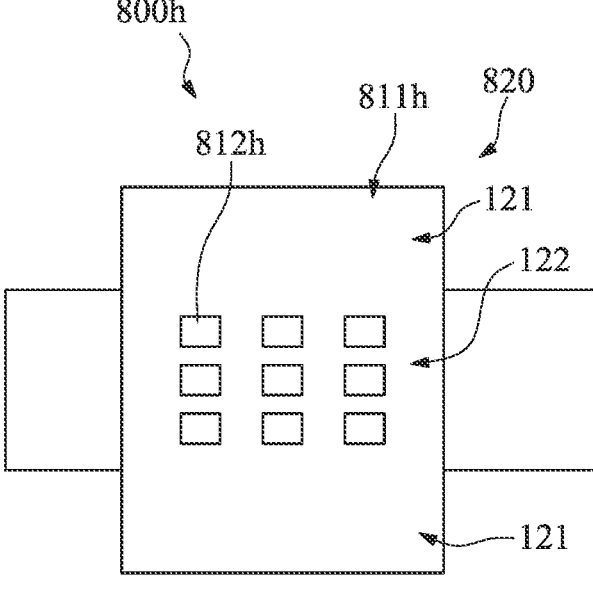
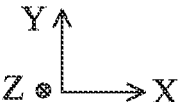
Fig. 8H

900

IDENTIFY A CANDIDATE GATE FEATURE 902

DETERMINE THE INTERSECTION OF THE CANDIDATE GATE FEATURE AND AN ACTIVE REGION TO DETERMINE A GATE REGION AND END REGIONS OF THE GATE FEATURE 904

DETERMINE A DUMMY PATTERN CHARACTERIZED BY A UNIT SIZE, A UNIT SHAPE, AND AN ARRANGEMENT 906

INSERT THE DUMMY PATTERN INTO THE GATE REGION AND THE END REGIONS 908

LARGE DIMENSION METAL GATE FIELD-EFFECT TRANSISTOR (FET) WITH METAL GATE DUMMY STRUCTURES

FIELD

Embodiments of the present disclosure relate generally to large dimension metal gate field-effect transistors (FETs), and more particularly to large dimension metal gate FETs with metal gate dummy structures.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flowchart diagram illustrating an example method of fabricating a semiconductor structure in accordance with some embodiments.

FIG. 4 is a flowchart diagram illustrating an example method of fabricating a semiconductor structure in accordance with some embodiments.

FIGS. 5A-5G are schematic diagrams illustrating cross-sectional views of a semiconductor structure at various fabrication stages in accordance with some embodiments.

FIG. 6 is a flowchart diagram illustrating an example method of fabricating a semiconductor structure in accordance with some embodiments.

FIGS. 7A-7G are schematic diagrams illustrating cross-sectional views of a semiconductor structure at various fabrication stages in accordance with some embodiments.

FIGS. 8A-8H are schematic diagrams illustrating layout views of various examples of a semiconductor structure including a dummy pattern in accordance with some embodiments.

DETAILED DESCRIPTION OF THE INVENTION

Figure 1A:
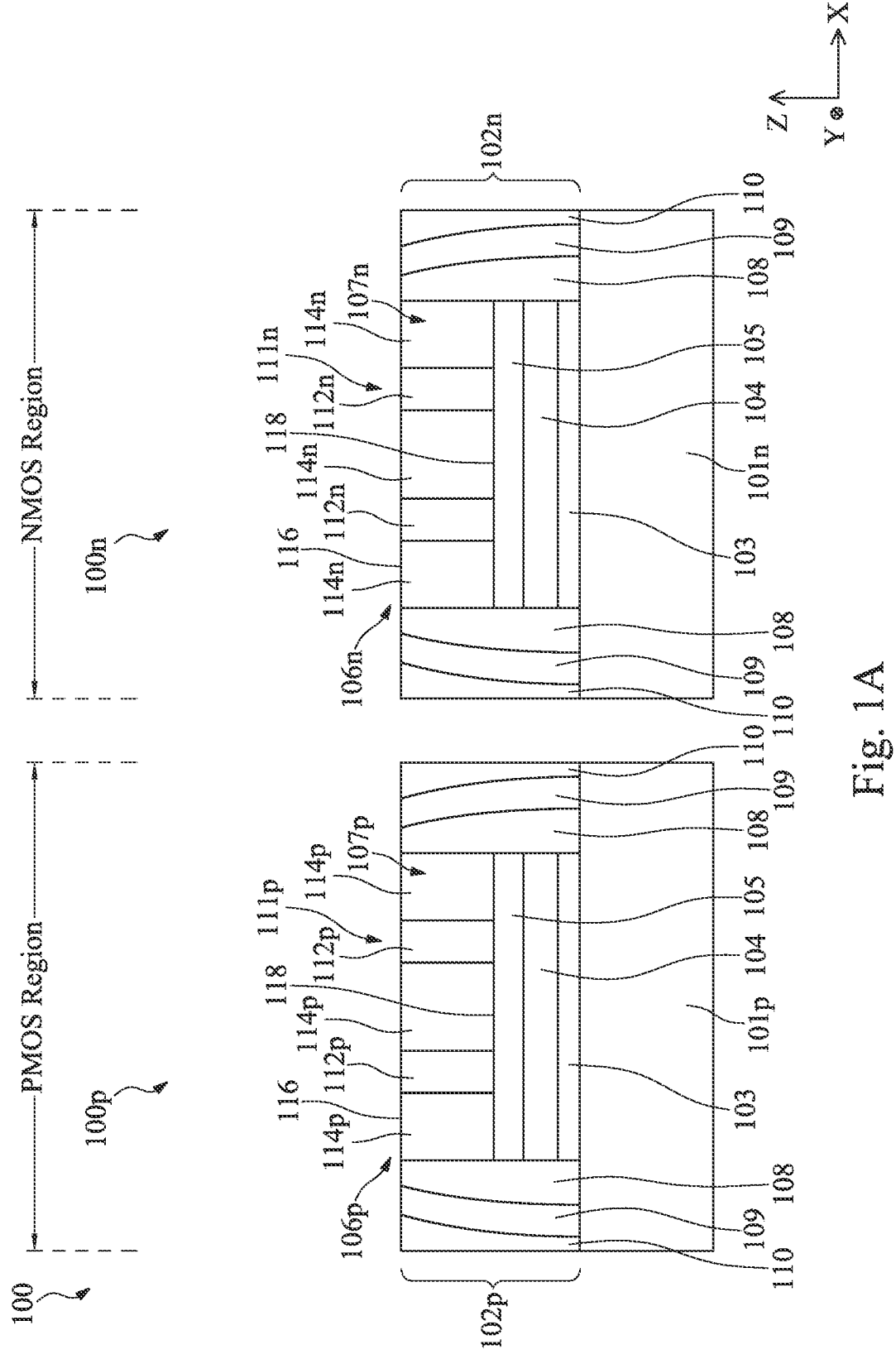
FIG. 1A is a schematic diagram illustrating a cross-sectional view of an example semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Large dimension metal gate field-effect transistors (FETs) are used in various applications, such as analog applications, high-voltage applications, CMOS image sensor (CIS) applications, bipolar-CMOS-DMOS (BCD) applications, and the like. One type of large dimension metal gate FETs is a large dimension metal gate metal-oxide-semiconductor field-effect transistor (MOSFET).

Conventionally, it is challenging to well control the thickness of the gate metal layer of a large dimension metal gate FET due to the chemical mechanical polishing (CMP) dishing effect. The CMP dishing effect causes a nonplanar surface at the top surface of the structure. The edge portion of the gate metal layer is generally thicker than the central portion of the gate metal layer. The mismatch in thickness results in the mismatch in the threshold voltage of the large dimension metal gate FET, which may even cause functional failure.

In accordance with other aspects of the disclosure, a novel semiconductor structure is provided. The semiconductor structure includes a p-type (i.e., a first semiconductor conductivity type) metal gate structure in a p-type metal-oxide-semiconductor (PMOS) region and an n-type (i.e., a second semiconductor conductivity type) metal gate structure in an n-type metal-oxide-semiconductor (NMOS) region. The p-type metal gate structure includes at least one p-type dummy structure disposed in a p-type metal gate layer. Likewise, the n-type metal gate structure includes at least one n-type dummy structure disposed in an n-type metal gate layer. The at least one p-type dummy structure comprises a material different from the material of the p-type metal gate layer; the at least one n-type dummy structure comprises a material different from the material of the n-type metal gate layer. Therefore, the p-type metal gate structure and n-type metal gate structure are both heterostructures. The heterogeneous nature of the metal gate structures (i.e., the p-type metal gate structure and the n-type metal gate structure) provides many advantages.

First, the metal gate structures can mitigate or minimize the CMP dishing effect during the CMOS fabrication process, due to CMP selectivity between the different materials (i.e., the different materials have different resistivities or polishing rates against the chemicals used in the CMP process). Second, the metal gate structures can have a uniform or substantially uniform gate thickness across the gate region. The uniform gate thickness can significantly reduce mismatch in the threshold voltage and mitigate the risk for functional failure, particularly in a large dimension metal gate FET. Third, the metal gate structures are found to have a flicker noise (which is associated with the interface traps generated at the interface between two different materials) level comparable to the conventional metal gate without the dummy structures. Therefore, the function of the metal gate structures is not compromised. Last but not least, the heterogenous metal gate structures can lift design constraints of the gate size and provide design flexibility to some extent.

In some embodiments, the p-type metal gate structure includes multiple p-type dummy structures that form a p-type dummy pattern, and the n-type metal gate structure includes multiple n-type dummy structures that form an n-type dummy pattern. The dummy patterns (i.e., the p-type dummy pattern and the n-type dummy pattern) can be designed by adjusting the unit size, unit shape, and arrangement of the dummy structures. The dummy patterns can be inserted into different regions of the gate feature of the semiconductor structure.

Example Large Dimension Metal Gate Layer with Dummy Structures

Figure 1B:
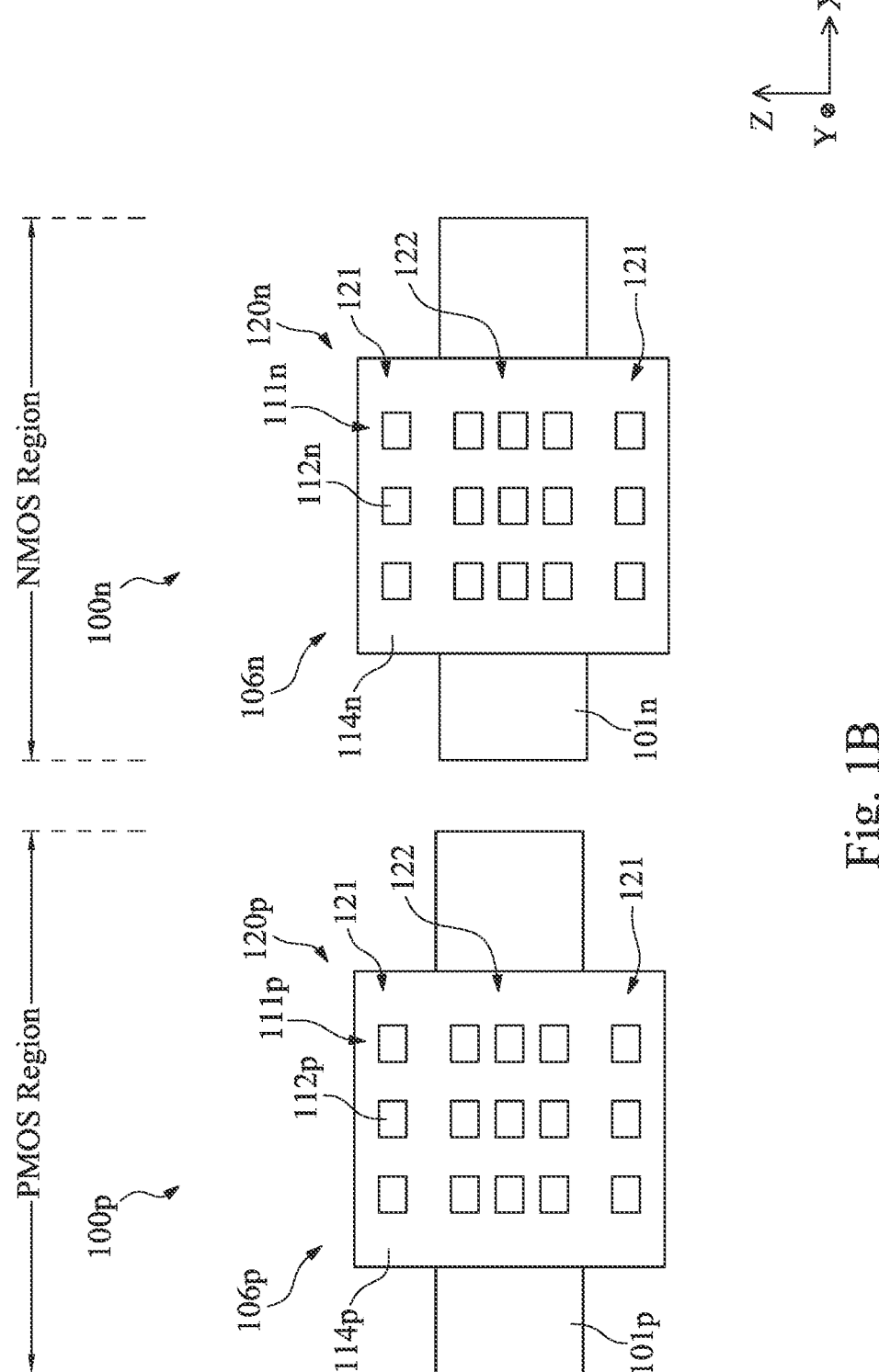
FIG. 1B is a schematic diagram illustrating an example layout of the semiconductor structure shown in FIG. 1A in accordance with some embodiments.

FIG. 1A is a schematic diagram illustrating a cross-sectional view of an example semiconductor structure 100 in accordance with some embodiments. FIG. 1B is a schematic diagram illustrating an example layout of the semiconductor structure 100 of FIG. 1A in accordance with some embodiments. The semiconductor structure 100 may be utilized in the complementary metal-oxide-semiconductor (CMOS) fabrication process, which uses complementary and symmetrical pairs of p-type and n-type MOSFETs for logic functions. It should be understood that the semiconductor structure 100, however, may be utilized in other applications where the thickness of the gate metal layer of a large dimension metal gate FET is hard to control due to the CMP dishing effect.

In the illustrated example, the semiconductor structure 100 includes a p-type semiconductor structure 100p and an n-type semiconductor structure 100n. The semiconductor structure 100 may be considered a pair of semiconductor structures, namely the p-type semiconductor structure 100p and the n-type semiconductor structure 100n. The p-type semiconductor structure 100p is located in a p-type metal-oxide-semiconductor (PMOS) region, and the n-type semiconductor structure 100n is located in an n-type metal-oxide-semiconductor (NMOS) region. Typically, the p-type semiconductor structure 100p is representative of multiple (e.g., hundreds of, thousands of, etc.) identical or similar p-type semiconductor structures disposed in the PMOS region; the n-type semiconductor structure 100n is typically representative of multiple (e.g., hundreds of, thousands of, etc.) identical or similar n-type semiconductor structures disposed in the NMOS region.

In the example of FIG. 1A, the p-type semiconductor structure 100p includes, among other components, a p-type active region (sometimes also referred to as a "p-type oxide diffusion (OD) region") 101p, a p-type gate stack 102p, two sidewall spacers 108, two sidewall portions of a contact etching stop layer (CESL) 109, and two sidewall portions of a phosphorous-doped oxide film (PDOF) 110. The p-type gate stack 102p is disposed on the p-type active region 101p. The two sidewall spacers 108 are respectively disposed on two sidewalls of the p-type gate stack 102p. The two sidewall portions of the contact etching stop layer 109 are respectively disposed on the two sidewall spacers 108, and the two sidewall portions of the phosphorous-doped oxide film 110 are respectively disposed on the two sidewall portions of the contact etching stop layer 109.

In the example of FIG. 1A, the p-type gate stack 102p includes a first gate dielectric layer 103, a second gate dielectric layer 104, a third gate dielectric layer 105, and a p-type metal gate structure 106p. The first gate dielectric layer 103 is disposed on the p-type active region 101p; the second gate dielectric layer 104 is disposed on the first gate dielectric layer 103; the third gate dielectric layer 105 is disposed on the second gate dielectric layer 104; the p-type metal gate structure 106p is disposed on the third gate dielectric layer 105. In one embodiment, the first gate dielectric layer 103 is a gate oxide layer; the second gate dielectric layer 104 is a high-K dielectric layer; the third gate dielectric layer 105 is a titanium nitride (TiN) layer. It should be understood that different combinations of gate dielectric layers may be employed in other embodiments. It should also be understood that other combinations of materials may be employed for the first gate dielectric layer 103, the second gate dielectric layer 104, and the third gate dielectric layer 105 in other embodiments.

In the example of FIG. 1A, the p-type metal gate structure 106p is disposed in a PMOS gate region 107p. The p-type metal gate structure 106p is disposed on the third gate dielectric layer 105 and extends in a vertical direction (i.e., the Z-direction shown in FIG. 1A) from a top surface 116 to a bottom surface 118. The p-type metal gate structure 106p extends horizontally (i.e., in the X-direction and in the Y-direction shown in FIG. 1A). The p-type metal gate structure 106p is characterized by a relatively large area in the X-Y plane. In other words, the p-type metal gate structure 106p is a large dimension p-type metal gate structure. The top surface 116 of the p-type metal gate structure 106p is flat or substantially flat in the X-Y plane.

In the example of FIG. 1A, the p-type metal gate structure 106p includes a p-type metal gate layer 114p and multiple p-type dummy structures 112p. Each p-type dummy structure 112p extends vertically through an entire thickness of the p-type metal gate structure 106p. These p-type dummy structures 112p form a p-type dummy pattern 111p, which will be discussed in detail below with reference to FIG. 1B. Although a specific number of p-type dummy structures 112p are illustrated in FIG. 1A, it should be understood that the principles are generally applicable to the p-type metal gate structure 106p including at least one p-type dummy structure 112p.

The p-type metal gate layer 114p comprises a first material, whereas the p-type dummy structures 112p comprises a second material different from the first material. In other words, the p-type metal gate layer 114p and the p-type dummy structures 112p comprise different materials. Therefore, the p-type metal gate structure 106p is a heterostructure. As will be discussed below in detail, the heterogeneous nature of the p-type metal gate structure 106p can mitigate the CMP dishing effect and lift design constraints of the gate size (i.e., provide more design flexibility) to some extent.

In some embodiments, the p-type metal gate layer 114p includes a metal (e.g., a single metal, a compound metal, or an alloy). In one embodiment, each of the p-type dummy structures 112p includes a metal (e.g., a single metal, a compound metal, or an alloy), which will be described in detail below with reference to FIGS. 2-3G. In another embodiment, each of the p-type dummy structures 112p includes polysilicon, which will be described in detail below with reference to FIGS. 4-5G. In yet another embodiment, each of the p-type dummy structures 112p comprises a dielectric material such as silicon oxide, which will be described in detail below with reference to FIGS. 6-7G. It should be understood that these examples are exemplary rather than limiting.

On the other hand, the n-type semiconductor structure 100n includes, among other components, an n-type active region (sometimes also referred to as a "n-type oxide diffusion (OD) region") 101n, an n-type gate stack 102n, two sidewall spacers 108, two sidewall portions of a contact etching stop layer 109, and two sidewall portions of a phosphorous-doped oxide film 110. The n-type gate stack 102n includes a first gate dielectric layer 103, a second gate dielectric layer 104, a third gate dielectric layer 105, and an n-type metal gate structure 106n. The n-type semiconductor structure 100n is similar to the p-type semiconductor structure 100p except for the n-type active region 101n and n-type metal gate structure 106n.

In the illustrated example, the n-type metal gate structure 106n is disposed in an NMOS gate region 107n and includes an n-type metal gate layer 114n and multiple n-type dummy structures 112n. Similar to the p-type dummy structure 112p, each n-type dummy structure 112n extends vertically through an entire thickness of the n-type metal gate structure 106n. These n-type dummy structures 112n form an n-type dummy pattern 111n. Although a specific number of n-type dummy structures 112n are illustrated in FIG. 1A, it should be understood that the principles are generally applicable to the n-type metal gate structure 106n including at least one n-type dummy structure 112n.

Similar to the p-type metal gate structure 106p, the n-type dummy structures 112n of the n-type metal gate structure 106n comprise a first material, whereas the n-type metal gate layer 114n comprises a second material different from the first material. In other words, the n-type metal gate layer 114n and the n-type dummy structures 112n comprise different materials. Therefore, the n-type metal gate structure 106n is also a heterostructure. Similar to the p-type metal gate structure 106p, the heterogeneous nature of the n-type metal gate structure 106n can also mitigate the CMP dishing effect and lift design constraints of the gate size (i.e., provide more design flexibility) to some extent.

In the example shown in FIG. 1B, in the PMOS region, the p-type active region 101p of the p-type semiconductor structure 100p extends in the X-direction of FIG. 1B; a p-type gate feature 120p (sometimes also referred to as a "POLY") extends in the Y-direction of FIG. 1B. The p-type gate feature 120p is laid over the p-type active region 101p in the Z-direction and overlaps with the p-type active region 101p in the X-Y plane. The p-type gate feature 120p further includes two end regions 121 and a gate region 122. The gate region 122 is located in an intersection area of the p-type gate feature 120p and the p-type active region 101p. The two end regions 121 are respectively located at two sides of the p-type gate feature 120p in the Y-direction.

As mentioned above, the p-type dummy structures 112p form a p-type dummy pattern 111p in the PMOS region. The p-type dummy pattern 111p is located in the p-type gate feature 120p. The p-type dummy pattern 111p can be characterized by a unit size of the p-type dummy structure 112p, a unit shape of the p-type dummy structure 112p, and an arrangement of the multiple p-type dummy structures 112p. The unit size, unit shape, and arrangement can vary depending on design requirements. In some embodiments, the p-type dummy structures 112p are disposed in both the gate region 122 and the two end regions 121. In other embodiments, the p-type dummy structures 112p are disposed in only the gate region 122.

Similarly, the n-type dummy structures 112n form an n-type dummy pattern 111n in the NMOS region. The n-type dummy pattern 111n is located in an n-type gate feature 120n. The n-type dummy pattern 111n can be characterized by a unit size of the n-type dummy structure 112n, a unit shape of the n-type dummy structure 112n, and an arrangement of the multiple n-type dummy structures 112n. The unit size, unit shape, and arrangement can vary depending on design requirements. In some embodiments, the n-type dummy structures 112n are disposed in both the gate region 122 and the two end regions 121. In other embodiments, the n-type dummy structures 112n are disposed in only the gate region 122.

Example Complementary Metal Dummy Structures

FIG. 2 is a flowchart diagram illustrating an example method 200 of fabricating a semiconductor structure in accordance with some embodiments. FIGS. 3A-3G are schematic diagrams illustrating cross-sectional views of a semiconductor structure 300 at various fabrication stages in accordance with some embodiments. As mentioned above, the semiconductor structure 300 may be used in the CMOS fabrication process.

In the illustrated example of FIG. 2, the method 200 includes operations 202, 204, 206, 208, 210, 212, 214, 216, 218, 220, 222, 224, 226, and 228. Additional operations may be performed. Also, it should be understood that the sequence of the various operations discussed above with reference to FIG. 2 is provided for illustrative purposes, and as such, other embodiments may utilize different sequences. These various sequences of operations are to be included within the scope of embodiments.

The method 200 starts at operation 202. At operation 202, a gate stack is formed. In some embodiments, a first gate dielectric layer is formed on an active region, a second gate dielectric layer is formed on the first gate dielectric layer, a third gate dielectric layer is formed on the second gate dielectric layer, and a polysilicon layer is formed on the third gate dielectric layer.

Figure 3A:
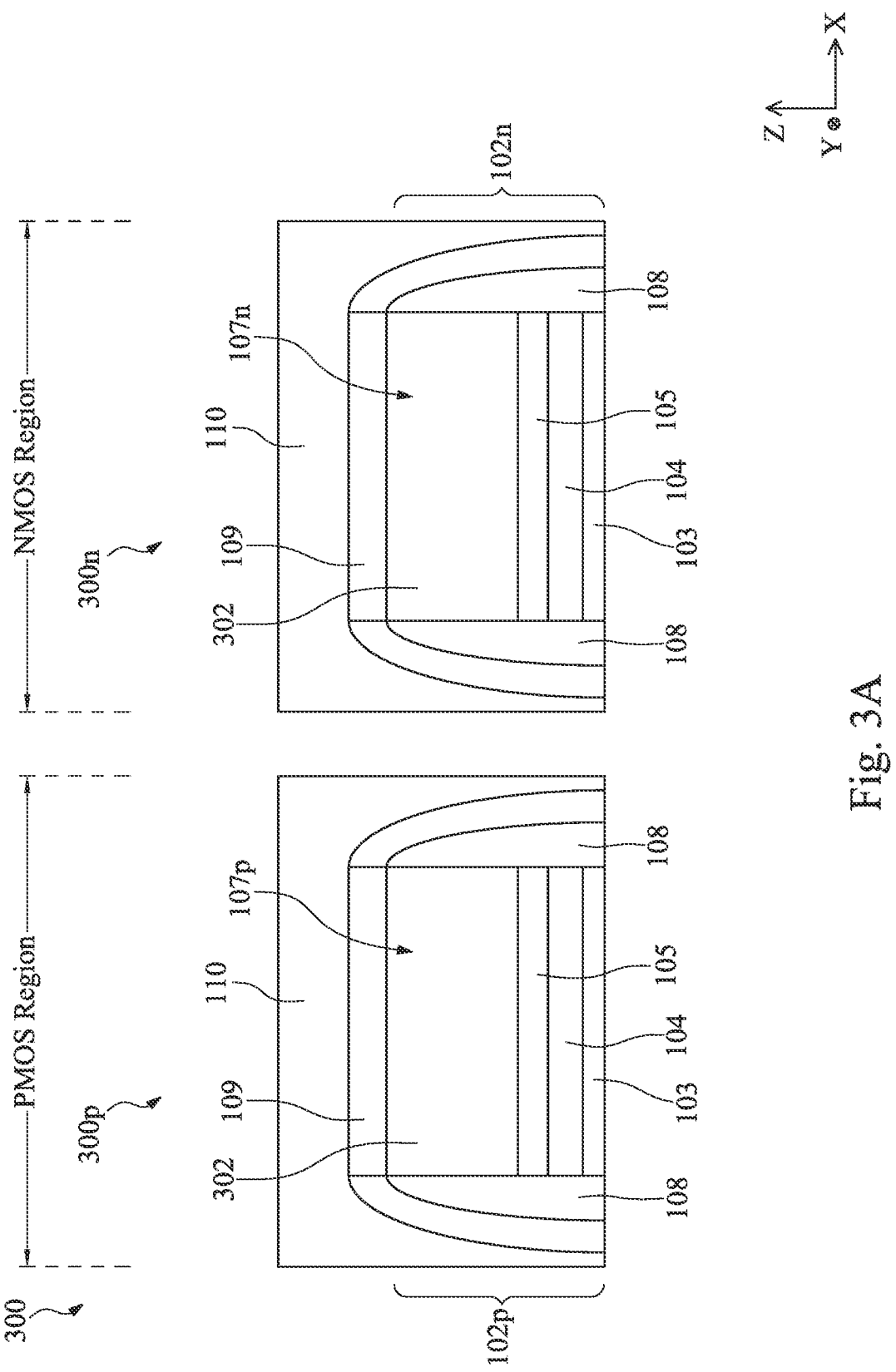
FIGS. 3A-3G are schematic diagrams illustrating cross-sectional views of a semiconductor structure at various fabrication stages in accordance with some embodiments.
Figure 3B:
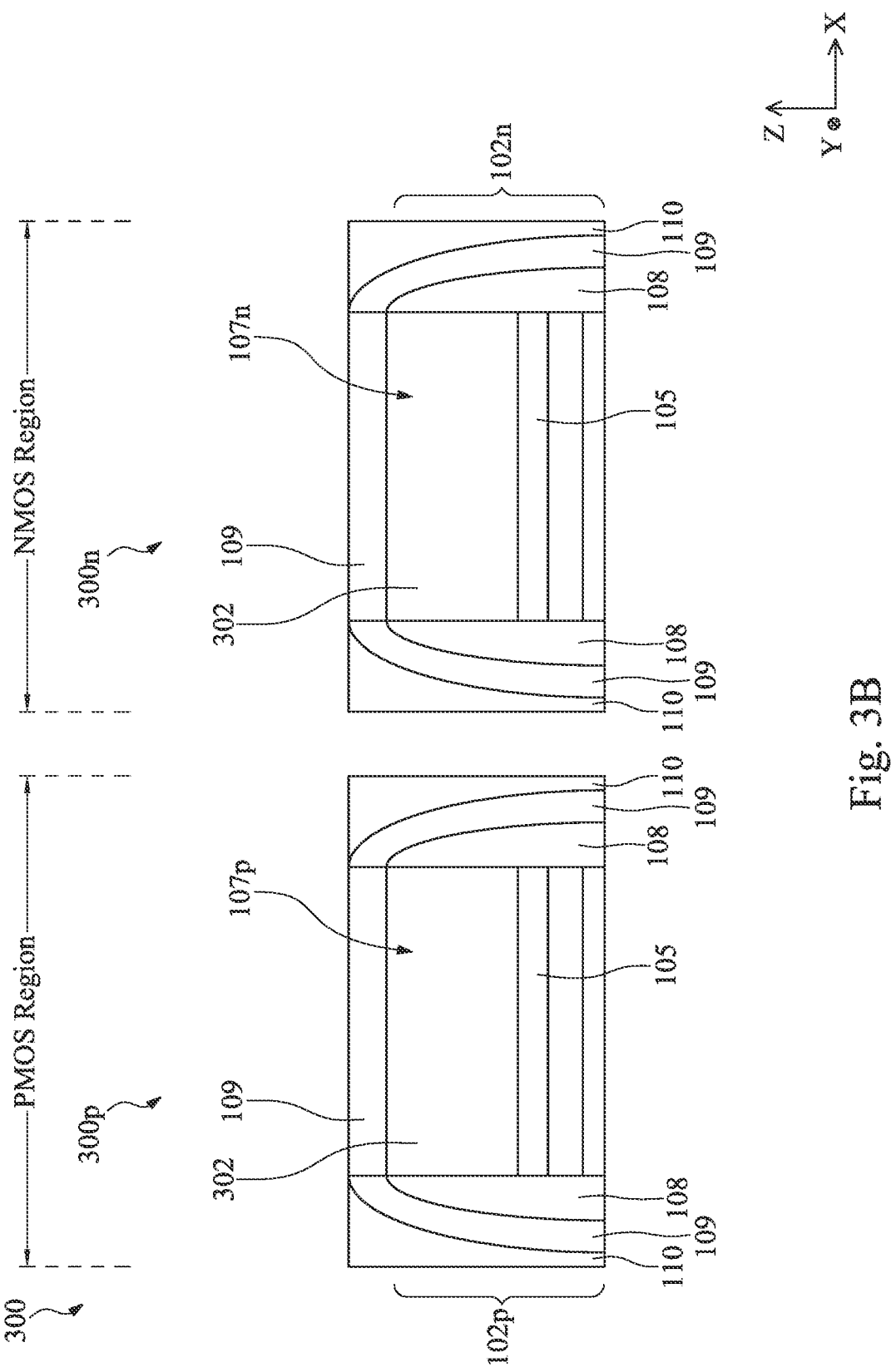
Figure 3C:
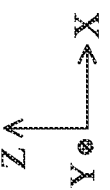

In the illustrated example of FIG. 3A, a semiconductor structure 300 includes a PMOS region and an NMOS region. A p-type gate stack 102p is formed in the PMOS region, and an n-type gate stack 102n is formed in the NMOS region for the fabrication of an n-type semiconductor structure. The p-type gate stack 102p includes the first gate dielectric layer 103 disposed on a p-type active region (such as the p-type active region 101p shown in FIG. 1A), the second gate dielectric layer 104 disposed on the first gate dielectric layer 103, the third gate dielectric layer 105 disposed on the second gate dielectric layer 104, and a polysilicon layer 302 disposed on the third gate dielectric layer 105. The polysilicon layer 302 is disposed in a PMOS gate region 107p. Likewise, the n-type gate stack 102n can be formed in the NMOS region, and the polysilicon layer 302 is disposed in an NMOS gate region 107n.

The first gate dielectric layer 103, the second gate dielectric layer 104, the third gate dielectric layer 105, and the polysilicon layer 302 may be formed by deposition techniques such as chemical oxidation, thermal oxidation, atomic layer deposition (ALD), chemical vapor deposition (CVD), physical vapor deposition (PVD), or other suitable deposition techniques.

In some embodiments, the first gate dielectric layer 103 comprises a gate oxide. Non-limiting examples of the gate oxide include silicon oxide ($SiO_2$), silicon oxynitride (SiON), or other appropriate dielectric materials. In some embodiments, the second gate dielectric layer 104 comprises a high-κ dielectric material. Examples of the high-κ dielectric material are provided in Table 1 below. It is noted that the examples in Table 1 are not intended to be limiting, and

TABLE 1

| Examples of high-κ materials | |
| --- | --- |
| High-κ dielectric materials | κ values |
| $SiO_2$ | about 3.9 |
| $Si_3N_4$ | about 7 |
| $Al_2O_3$ | about 9 |
| $Y_2O_3$ | about 15 |
| $TiO_2$ | about 80 |
| $HfO_2$ | about 25 |
| $ZrO_2$ | about 25 |
| ZAZ ($ZrO_2/Al_2O_3/ZrO_2$) | Defined by Z/A/Z ratio |
| AZA ($Al_2O_3/ZrO_2/Al_2O_3$) | Defined by A/Z/A ratio |
| ZAZAZ ($ZrO_2/Al_2O_3/ZrO_2/Al_2O_3/ZrO_2$) | Defined by Z/A/Z/A/Z ratio | the second gate dielectric layer 104 may comprise other high-κ materials in alternative embodiments.

In some embodiments, the third gate dielectric layer 105 comprises titanium nitride (TIN). Other dielectric materials may also be possible choices for the third gate dielectric layer 105 in alternative embodiments. In some embodiments, the third gate dielectric layer 105 has a lower K value compared with the second gate dielectric layer 104.

At operation 204, sidewall spacers are formed on sidewalls of the gate stack. In the illustrated example of FIG. 3A, the sidewall spacers 108 are respectively formed on the two sidewalls of the p-type gate stack 102p in the PMOS region. Similarly, the sidewall spacers 108 are respectively formed on the two sidewalls of the n-type gate stack 102n in the NMOS gate region. The sidewall spacers 108 may include a dielectric material such as silicon oxide, silicon nitride, silicon carbide, silicon oxynitride, or any combination thereof.

At operation 206, a contact etching stop layer is formed on the gate stack. The contact etching stop layer 109 may include a dielectric material such as silicon nitride or carbon-doped silicon nitride. The contact etching stop layer 109 may be formed by a deposition technique such as CVD, plasma-enhanced CVD (PECVD), sub-atmospheric CVD (SACVD), molecular layer deposition (MLD), sputtering, or other suitable techniques. In the illustrated example of FIG. 3A, the contact etching stop layer 109 is formed on both the p-type gate stack 102p in the PMOS region and the n-type gate stack 102n in the NMOS region. The contact etching stop layer 109 has a top portion covering the polysilicon layer 302 and two sidewall portions respectively covering the two sidewall spacers 108.

At operation 208, a phosphorous-doped oxide film is formed on the contact etching stop layer. The phosphorous-doped oxide film may be formed by a deposition technique such as CVD, PECVD, or other suitable techniques. In the illustrated example of FIG. 3A, the phosphorous-doped oxide film 110 is formed on the contact etching stop layer 109 in both the PMOS gate region 107p and the NMOS gate region 107n. The phosphorous-doped oxide film 110 has a top portion covering the top portion of the contact etching stop layer 109 and two sidewall portions respectively covering the two sidewall portions of the contact etching stop layer 109.

At operation 210, a top portion of the phosphorous-doped oxide film is removed. In some implementations, the top portion of the phosphorous-doped oxide film is removed using a planarization process such as a chemical-mechanical polishing (CMP) process. In the illustrated example of FIG. 3B, the top portion of the contact etching stop layer 109 is exposed after the top portion of the phosphorous-doped oxide film 110 is removed. The sidewall portions of the phosphorous-doped oxide film 110 remain on the sidewall portions of the contact etching stop layer 109.

At operation 212, a top portion of the contact etching stop layer is removed. In some implementations, the top portion of the contact etching stop layer may be removed by a planarization process such as a CMP process. In the example shown in FIG. 3B, the CMP process is performed on the top portion of the contact etching stop layer 109 until the polysilicon layer 302 below the contact etching stop layer 109 is polished out (i.e., exposed).

At operation 214, a first oxide stop layer is formed on the polysilicon layer. The first oxide stop layer may be formed by a suitable deposition technique such as PVD or CVD. In the illustrated example of FIG. 3C, a first oxide stop layer 308 is deposited on and in contact with the polysilicon layer 302 of both the p-type gate stack 102p and the n-type gate stack 102n.

At operation 216, the polysilicon layer is patterned and etched to form multiple dummy pattern openings in the NMOS gate region and a complementary pattern trench in the PMOS gate region. The dummy pattern openings in the NMOS gate region and the complementary pattern trench in the PMOS gate region are complementary to each other (i.e., the patterns thereof make up the entire PMOS gate region 107p or the entire NMOS gate region 107n). In the illustrated example of FIG. 3D, multiple dummy pattern openings 311 and a complementary pattern trench 312 are simultaneously formed using a patterning and etching process. The dummy pattern openings 311 are formed in the NMOS gate region 107n, and the complementary pattern trench 312 is formed in the PMOS gate region 107p. Each dummy pattern opening 311 extends vertically through an entire thickness of the polysilicon layer 302.

Similarly, the complementary pattern trench 312 extends vertically through an entire thickness of the polysilicon layer 302. Consequently, multiple residual structures 314*p* are formed, and the multiple residual structures 314*p* include the unconsumed polysilicon layer 302 that remains in the PMOS gate region 107*p*. The multiple residual structures 314*p* serve as placeholders for p-type dummy structures 112*p*-1 (i.e., a first example of the p-type dummy structure 112*p* shown in FIG. 1A), which will be formed subsequently, as discussed below with reference to FIG. 3G.

At operation 218, a p-type metal gate layer is formed. In some embodiments, a p-type metal layer is deposited using a suitable deposition technique such as ALD, CVD, or PVD. In the example shown in FIG. 3E, the p-type metal layer is formed in the complementary pattern trench 312 shown in FIG. 3D in the PMOS gate region 107*p* to form the p-type metal gate layer 114*p*. The p-type metal layer is simultaneously formed in the multiple dummy pattern openings 311 shown in FIG. 3D in the NMOS gate region 107*n* to form the multiple n-type dummy structures 112*n*-1 (i.e., a first example of the n-type dummy structure 112*n* shown in FIG. 1A). Accordingly, the p-type metal gate layer 114*p* in the PMOS gate region 107*p* and the multiple n-type dummy structures 112*n*-1 in the NMOS gate region 107*n* have the same material (i.e., the material of the p-type metal layer). The multiple n-type dummy structures 112*n*-1 form an n-type dummy pattern 111*n*-1.

At operation 220, a CMP process is performed to remove the excess p-type metal layer. In the illustrated example of FIG. 3E, the CMP process is performed until the residual structures 314*p* in the PMOS gate region 107*p* and the n-type dummy structures 112*n*-1 in the NMOS gate region 107*n* are polished out (i.e., exposed). In the example shown in FIGS. 3D-3E, before the CMP process is performed, the p-type metal gate layer 114*p* comprises metal, each of the multiple residual structure 314*p* comprises polysilicon, and the first oxide stop layer 308 comprises silicon oxide. It is noted that the CMP process can have selectivity between the metal of the p-type metal gate layer 114*p* and the polysilicon of the multiple residual structures 314*p*, due to their different resistivities or polishing rates against the chemicals used in the CMP process. For similar reasons, the CMP process can also have selectivity between the metal of the p-type metal gate layer 114*p* and the silicon oxide of the first oxide stop layer 308. Because of the CMP selectivity, the CMP dishing effect can be mitigated or minimized, and a flat or substantially flat top surface 324 can be achieved after the CMP process.

At operation 222, a second oxide stop layer is formed. The second oxide stop layer 316 is formed on and in contact with the p-type metal gate layer (e.g., the p-type metal gate layer 114*p* shown in FIG. 3E) and the multiple residual structures (e.g., the multiple residual structures 314*p* shown in FIG. 3E) in the PMOS region. The second oxide stop layer 316 is simultaneously formed on the polysilicon layer (e.g., the polysilicon layer 302 shown in FIG. 3E) and the multiple n-type dummy structures (e.g., the multiple n-type dummy structures 112*n*-1 of FIG. 3E) in the NMOS region.

At operation 224, the polysilicon layer is patterned and etched to form dummy pattern openings in the PMOS gate region and a complementary pattern trench in the NMOS gate region. In the illustrated examples of FIGS. 3E-3F, the multiple dummy pattern openings 317 are formed in the PMOS gate region 107*p* by removing the corresponding residual structures 314*p* (i.e., the polysilicon layer that remains in the PMOS gate region 107*p*) during the patterning and etching process. Simultaneously, the complementary pattern trench 318 is formed in the NMOS gate region 107*n* by removing the polysilicon layer 302 that remains in the NMOS gate region 107*n*).

Figure 3D:
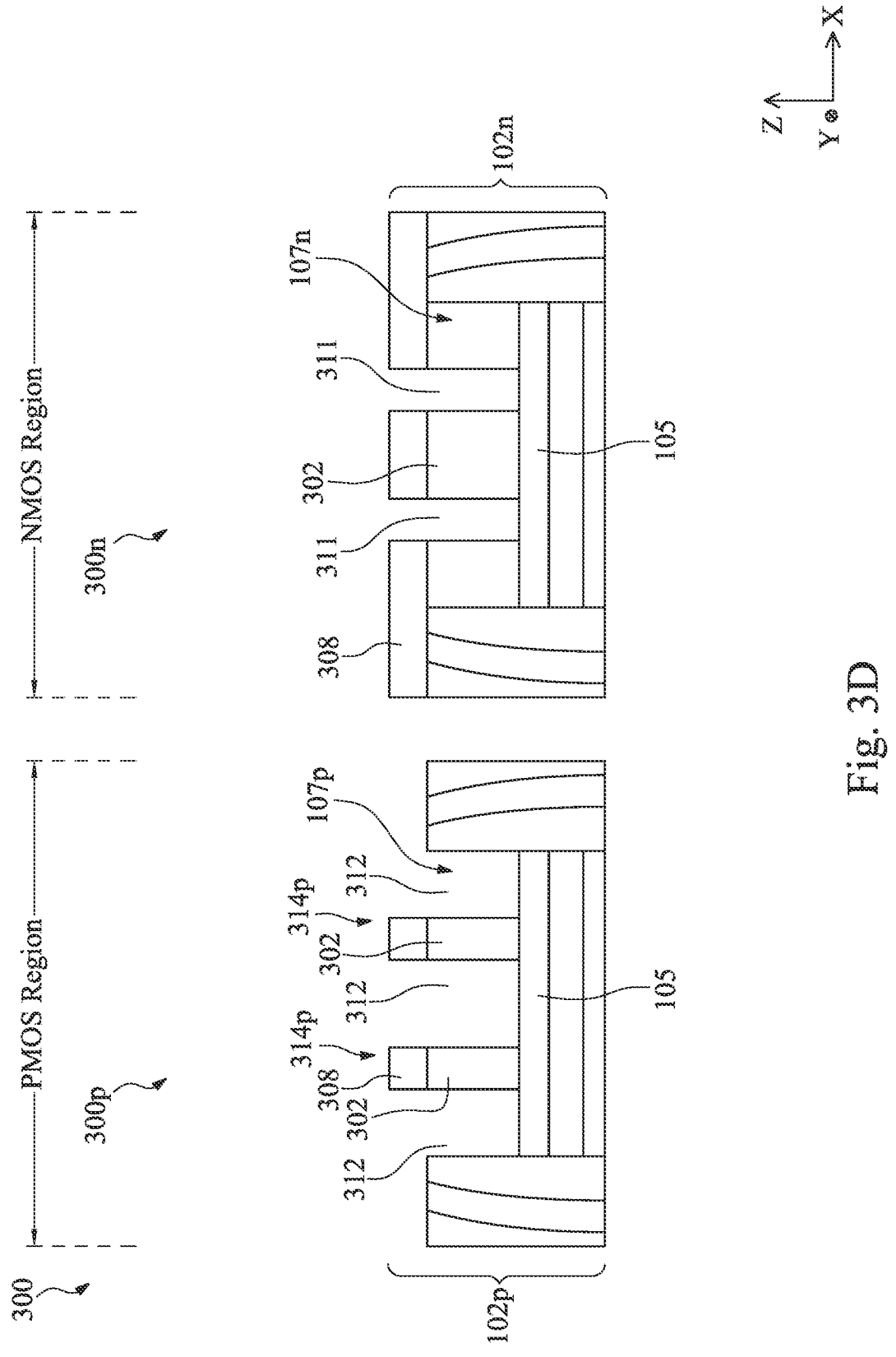
Figure 3E:
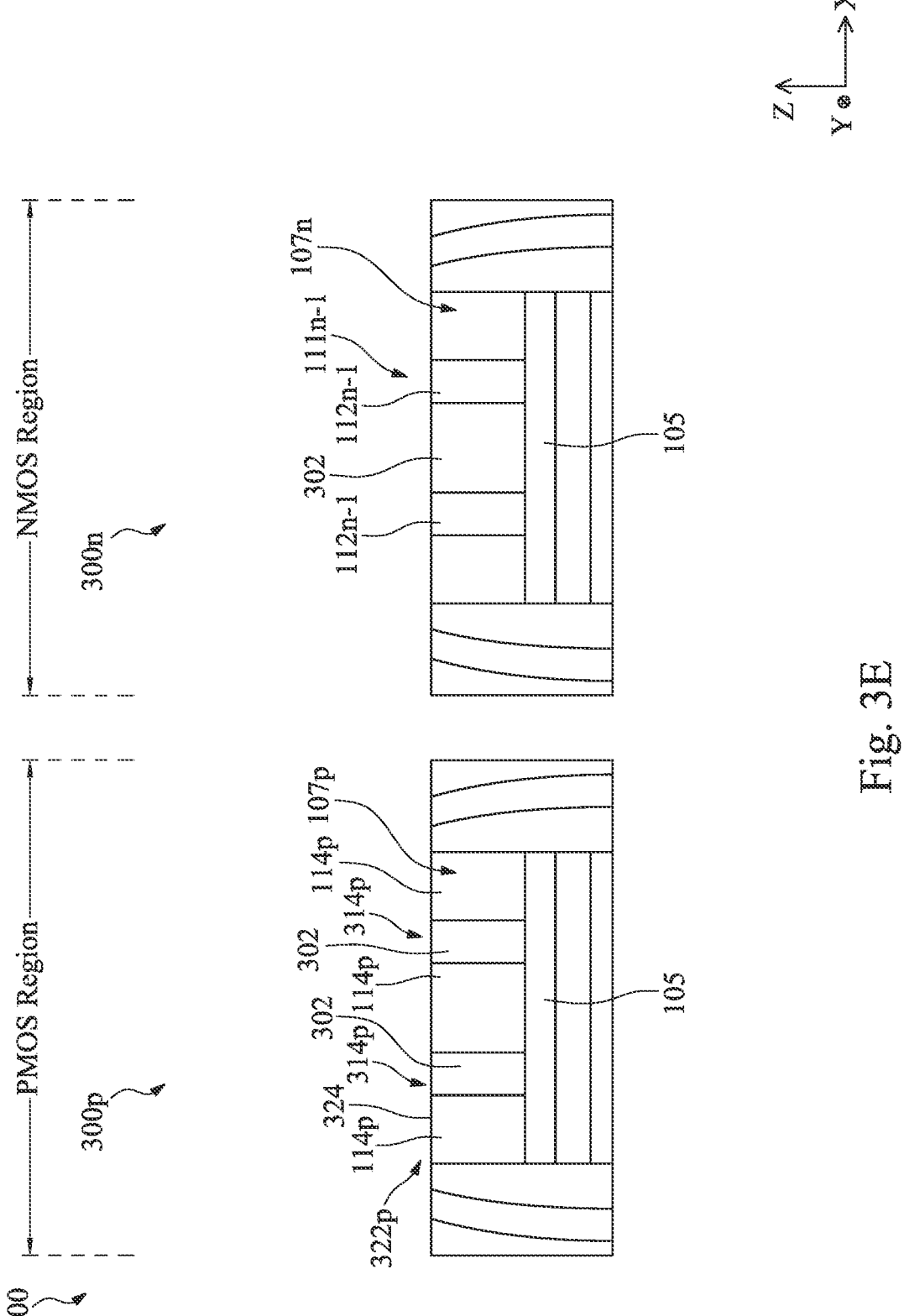
Figure 3F:
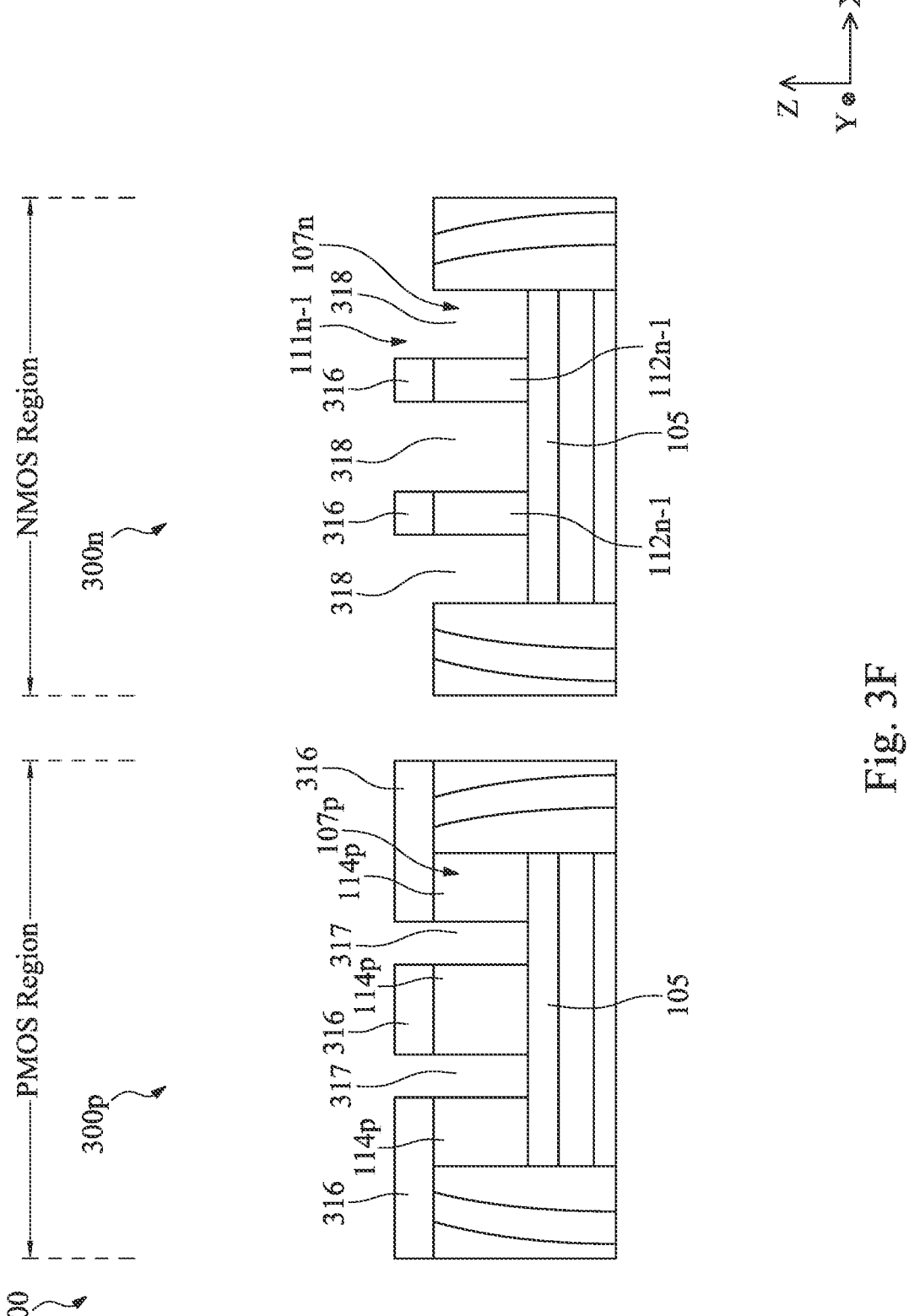

Similar to the dummy pattern openings 311 shown in FIG. 3D, each of the dummy pattern openings 317 shown in FIG. 3F extends vertically through an entire thickness of the p-type metal gate layer 114*p*, and the complementary pattern trench 318 extends vertically through an entire thickness of the polysilicon layer 302.

At operation 226, an n-type metal gate layer is formed. In some embodiments, an n-type metal layer is deposited using a suitable deposition technique such as ALD, CVD, or PVD. In the example shown in FIG. 3G, the n-type metal layer is formed in the complementary pattern trench 318 shown in FIG. 3F in the NMOS gate region 107*n* to form the n-type metal gate layer 114*n*. The n-type metal layer is simultaneously formed in the multiple dummy pattern openings 317 shown in FIG. 3F in the PMOS gate region 107*p* to form the multiple p-type dummy structures 112*p*-1. Accordingly, the n-type metal gate layer 114*n* in the NMOS gate region 107*n* and the multiple p-type dummy structures 112*p*-1 in the PMOS gate region 107*p* have the same material (i.e., the material of the n-type metal layer). The multiple p-type dummy structures 112*p*-1 form a p-type dummy pattern 111*p*-1.

In some embodiments, each of the p-type metal gate layer in the PMOS gate region and the n-type dummy structures in the NMOS gate region comprises a first material, whereas each of the n-type metal gate layer in the NMOS gate region and the p-type dummy structures in the PMOS gate region comprises a second material different from the first material. The first material and the second material may be a single metal, a compound metal, or an alloy. In some embodiments, the first material is a first metal, whereas the second material is a second metal different from the first metal. In some embodiments, the first material has a first metal work function, whereas the second material has a second metal work function equal to or higher than the first metal work function. In some embodiments, the first metal work function is in a range from about 3.0 eV to about 4.5 eV. In some embodiments, the second metal work function is in a range from about 4.5 eV to about 5.2 eV. In some embodiments, the second metal work function is equal to or more than the first metal work function. Example material choices for the p-type metal gate layer and the n-type metal gate layer are provided in Table 2. It is noted that the example materials in Table 2 are not intended to be limiting, and other materials may also be possible choices in alternative embodiments.

TABLE 2

| Examples materials and the corresponding metal work function ranges for the p-type metal gate layer and the n-type metal gate layer | |
| --- | --- |
| Materials | Metal work function ranges (eV) |
| Ti | from about 3.95 to about 4.33 |
| Al | from about 4.06 to about 4.2 |
| Ta | from about 4.0 to about 4.3 |
| $ZrSi_2$ | from about 4.0 to about 4.4 |
| TaN | from about 4.2 to about 4.5 |
| $TaSi_x$ | about 4.2 |
| $MoSi_x$ | from about 4.6 to about 4.8 |
| $NiSi_x$ | from about 4.6 to about 4.9 |
| W | about 4.6 |
| HfN | from about 4.7 to about 5.0 |
| TiN | from about 4.7 to about 5.0 |
| Mo | from about 4.5 to about 4.9 |
| Ru | from about 4.8 to about 5.1 |
| Ir | from about 4.6 to about 5.6 |

TABLE 2-continued

Examples materials and the corresponding metal work function ranges
for the p-type metal gate layer and the n-type metal gate layer

| Materials | Metal work function ranges (eV) |
|-----------|--------------------------------|
| Pt | from about 5.2 to about 5.6 |
| PtSi | from about 4.9 to about 5.0 |
| MoN | from about 4.8 to about 5.2 |

At operation 228, a CMP process is performed to remove the excess n-type metal layer. In the illustrated example of FIG. 3G, the CMP process is performed until the multiple n-type dummy structures 112n-1 in the NMOS gate region 107n and the p-type metal gate layer 114p in the PMOS gate region 107p are polished out (i.e., exposed). The p-type metal gate layer 114p and the multiple p-type dummy structures 112p-1 form the p-type metal gate structure 106p-1 in the PMOS gate region 107p, and the n-type metal gate layer 114n and the multiple n-type dummy structures 112n-1 form the n-type metal gate structure 106n-1 in the NMOS gate region 107n.

Figure 3G:
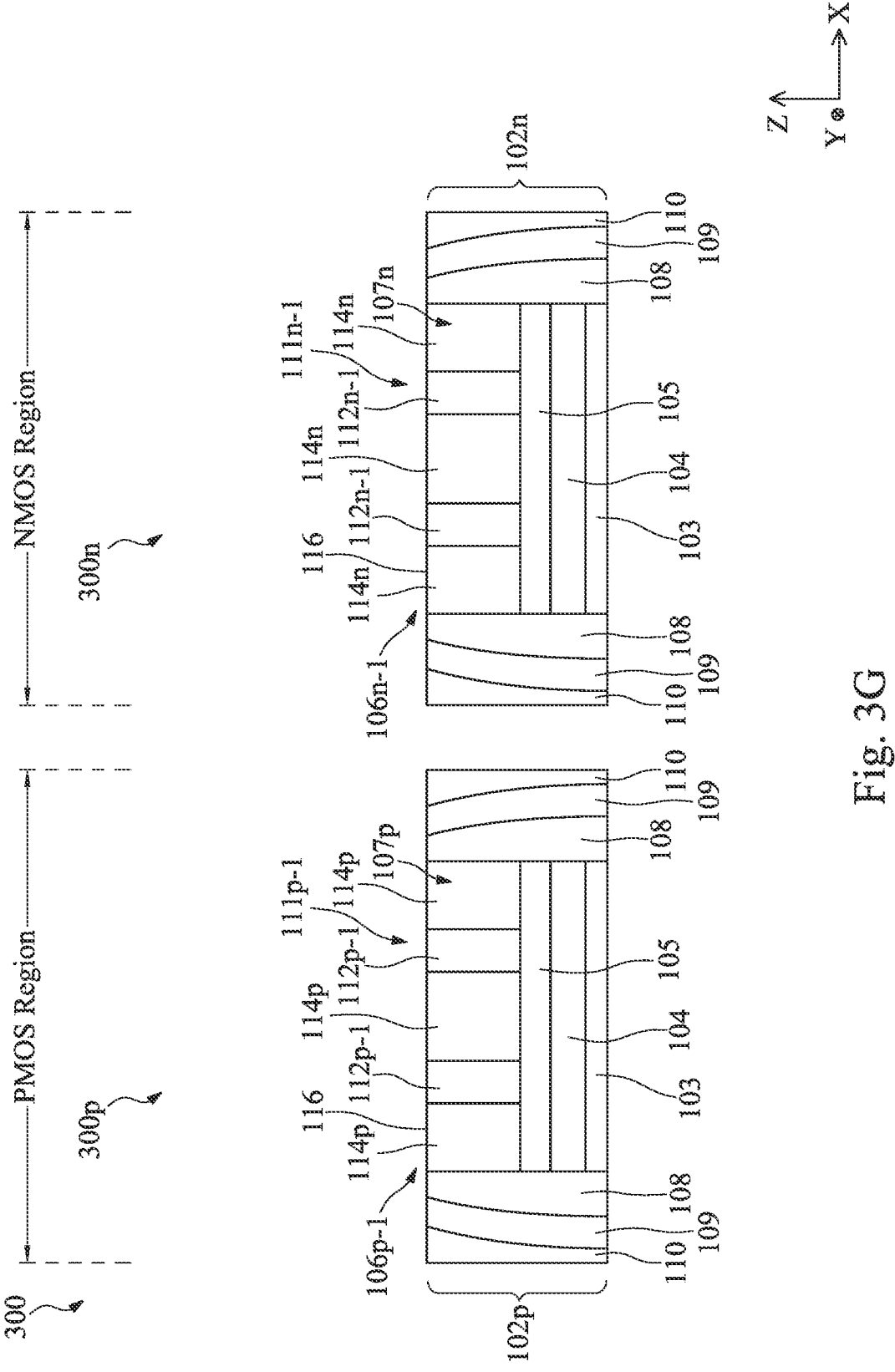

In the example shown in FIGS. 3F-3G, before the CMP process is performed, each of the n-type dummy structures 112n-1 comprises a first metal, the n-type metal gate layer 114n comprises a second metal, and the second oxide stop layer 316 comprises silicon oxide. It is noted that the CMP process can have selectivity between the first metal of the n-type dummy structures 112n-1 and the second metal of the n-type metal gate layer 114n, due to their different resistivities against the chemicals used in the CMP process. For similar reasons, the CMP process can also have selectivity between the second metal of the n-type metal gate layer 114n and the silicon oxide of the second oxide stop layer 316. Because of the CMP selectivity, the CMP dishing effect can be mitigated or minimized, and a flat or substantially flat top surface 116 can be achieved after the CMP process. Accordingly, each of the p-type metal gate structure 106p-1 and the n-type metal gate structure 106n-1 has a uniform or substantially uniform gate thickness across the PMOS gate region 107p and the NMOS gate region 107n, respectively.

The uniform gate thickness can significantly reduce mismatch in the threshold voltage (by 83% for the n-type and 91% for the p-type, in one example; by 82% for the n-type and 92% for the p-type, in another example) and mitigate the risk for functional failure, particularly in a large dimension metal gate FET. Moreover, the p-type metal gate structure 106p-1 and the n-type metal gate structure 106n-1 are found to have a flicker noise (which is associated with the interface traps generated at the interface between two different materials) level comparable to the conventional metal gate without the dummy structures. Therefore, the function of the p-type metal gate structure 106p and the n-type metal gate structure 106n is not compromised.

Example Polysilicon Dummy Structures

FIG. 4 is a flowchart diagram illustrating an example method 400 of fabricating a semiconductor structure in accordance with some embodiments. FIGS. 5A-5G are schematic diagrams illustrating cross-sectional views of a semiconductor structure 500 at various fabrication stages in accordance with some embodiments. The semiconductor structure 500 is a variation of the semiconductor structure 300 shown in FIGS. 3A-3G.

Figure 5A:
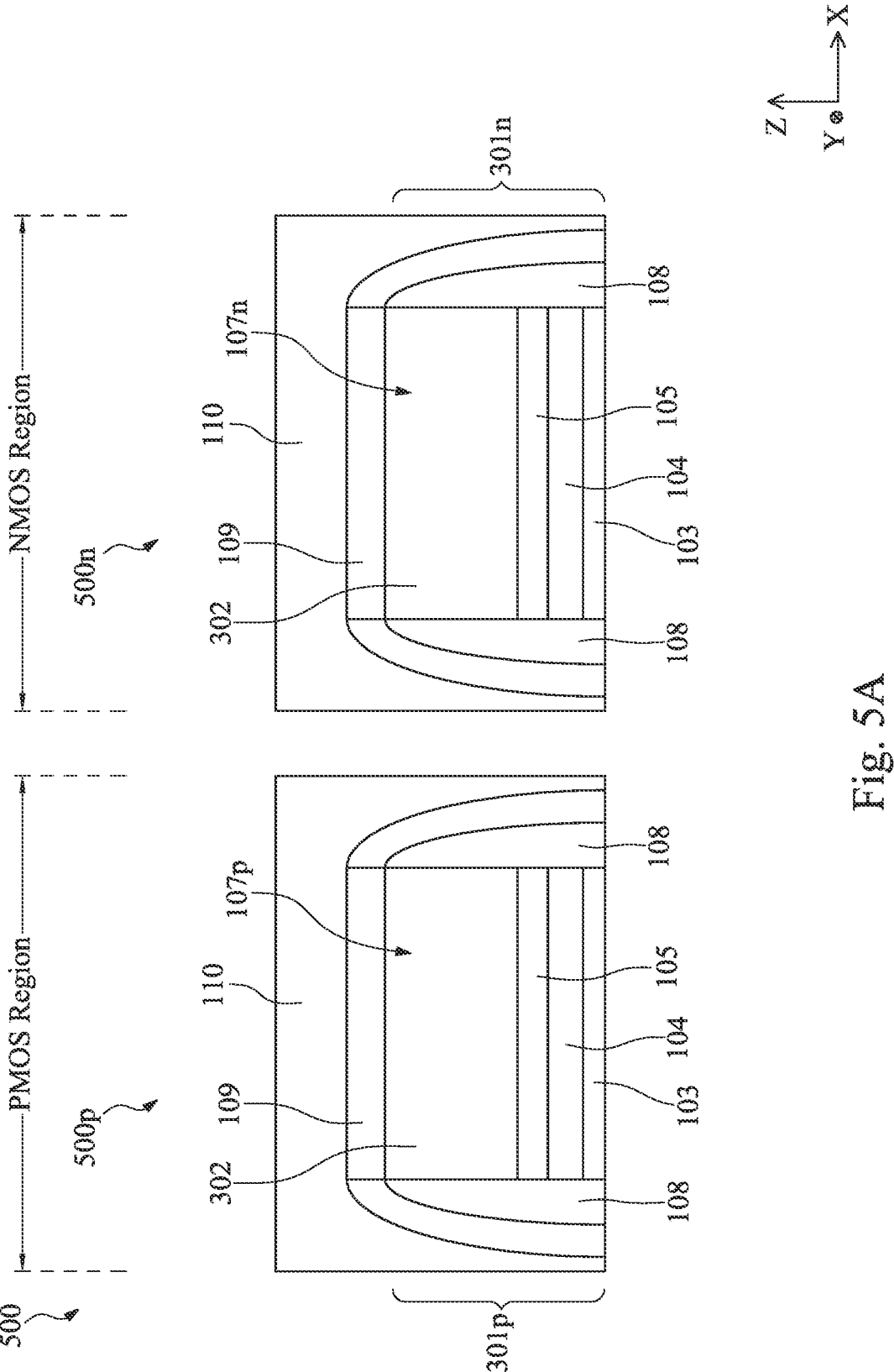
Figure 5B:
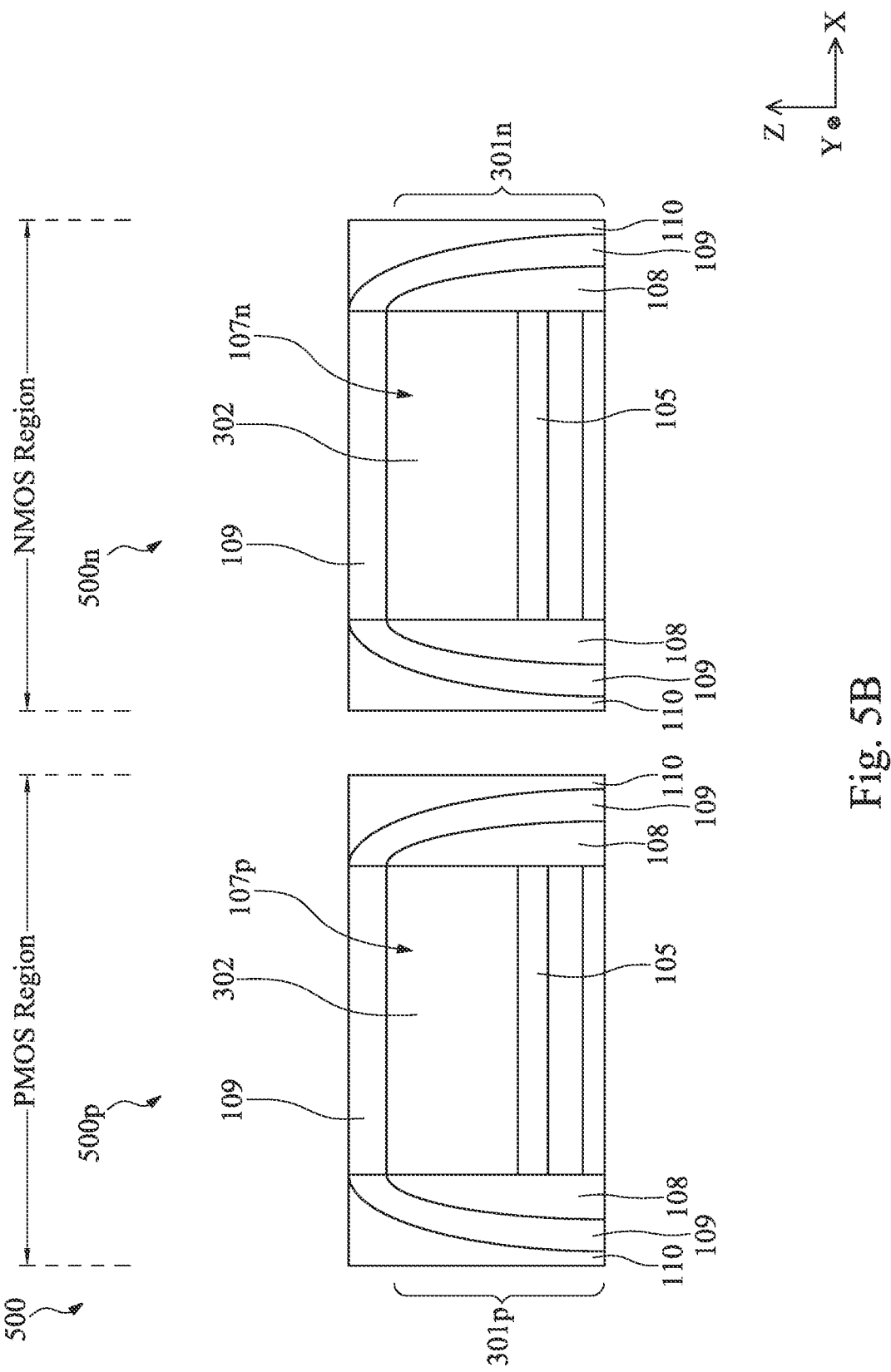
Figure 5C:
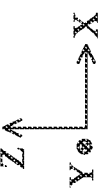

In the illustrated example of FIG. 4, the method 400 includes operations 402, 404, 406, 408, 410, 412, 414, 416, 418, 420, 422, 424, 426, and 428. It is noted that operations 402, 404, 408, 410, 412, and 414 are identical or similar to operations 202, 204, 206, 208, 210, 212, and 214 of the method 200 shown in FIG. 2 and therefore will not be repeated unless otherwise indicated. Accordingly, the semiconductor structure 500 shown in FIGS. 5A-5C is identical or similar to the semiconductor structure 300 shown in FIGS. 3A-3C.

At operation 416, the polysilicon layer is patterned and etched to form a complementary pattern trench in the PMOS gate region. In the illustrated example of FIG. 5D, a patterning and etching process is performed on the polysilicon layer 302 in the PMOS gate region 107p to form the complementary pattern trench 312. Consequently, the unconsumed polysilicon layer 302 that remains in the PMOS gate region 107p forms multiple p-type dummy structures 112p-2 (i.e., a second example of the p-type dummy structure 112p shown in FIG. 1A) surrounded by the complementary pattern trench 312. The multiple p-type dummy structures 112p-2 form a p-type dummy pattern 111p-2. However, the polysilicon layer 302 in the NMOS gate region 107n is protected by a first photoresist layer 502 disposed on the first oxide stop layer 308 and remains unchanged during the patterning and etching process. Therefore, no dummy pattern opening is formed in the NMOS gate region 107n.

Figure 5E:
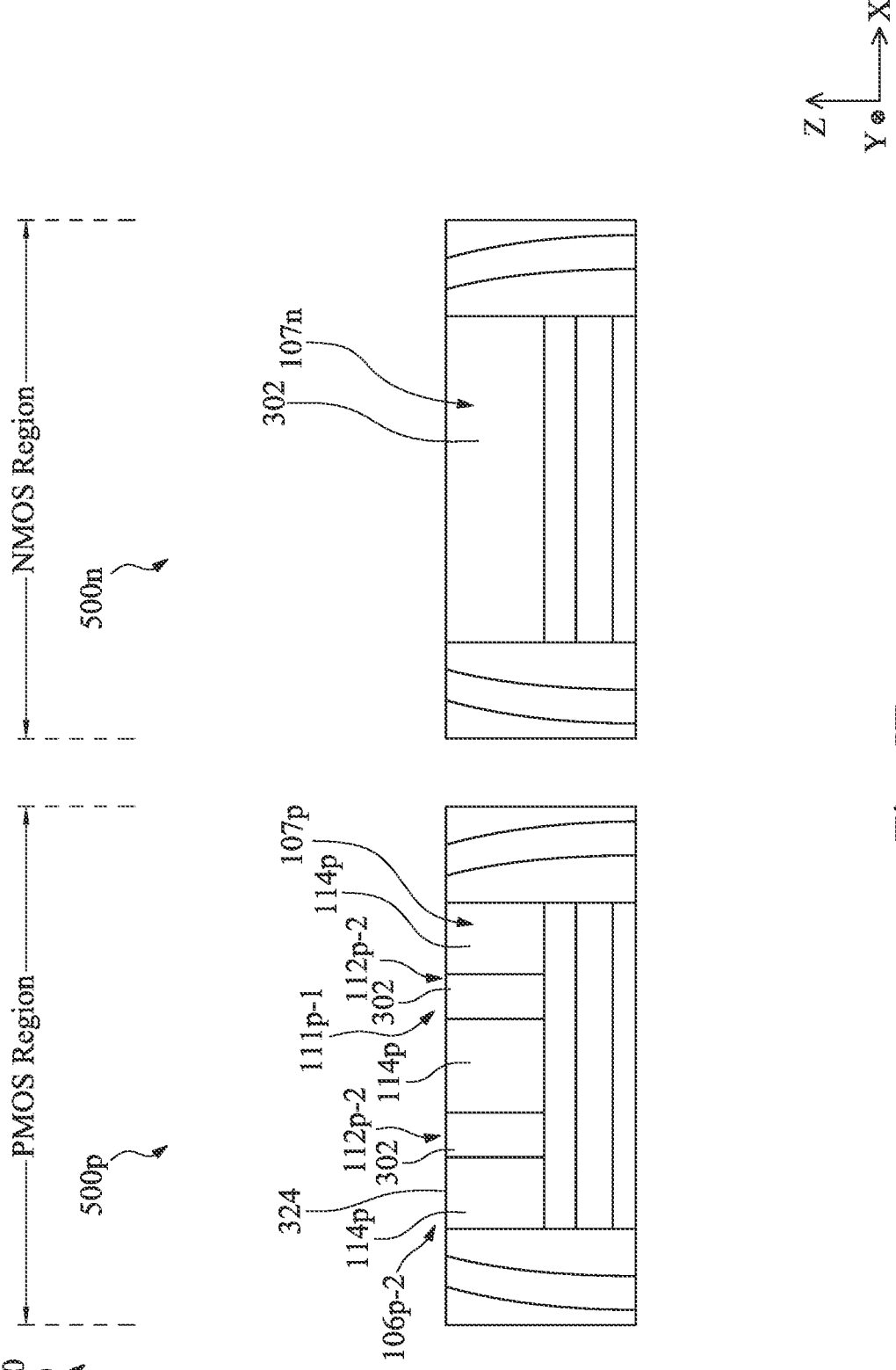

At operation 418, a p-type metal gate layer is formed. As shown in FIG. 5E, a p-type metal layer is formed in the complementary pattern trench 312 shown in FIG. 5D in the PMOS gate region 107p to form the p-type metal gate layer 114p. The p-type metal gate layer 114p and the multiple p-type dummy structures 112p-2 form the p-type metal gate structure 106p-2.

At operation 420, a CMP process is performed to remove the excess p-type metal layer. In the illustrated example of FIG. 5E, the CMP process is performed until the p-type dummy structures 112p-2 in the PMOS gate region 107p and the polysilicon layer 302 in the NMOS gate region 107n are polished out (i.e., exposed). The first oxide stop layer 308 is also removed by the CMP process.

In the example shown in FIGS. 5D-5E, before the CMP process is performed, the p-type metal gate layer 114p comprises a first metal, each of the multiple p-type dummy structures 112p-2 comprises polysilicon, and the first oxide stop layer 308 comprises silicon oxide. As mentioned above, the CMP process can have selectivity between the first metal of the p-type metal gate layer 114p and the polysilicon of the multiple p-type dummy structures 112p-2, due to their different resistivities or polishing rates against the chemicals used in the CMP process. For similar reasons, the CMP process can also have selectivity between the first metal of the p-type metal gate layer 114p and the silicon oxide of the first oxide stop layer 308. Because of the CMP selectivity, the CMP dishing effect can be mitigated or minimized, and a flat or substantially flat top surface 324 can be achieved after the CMP process.

At operation 422, a second oxide stop layer is formed. In the illustrated example of FIG. 5F, the second oxide stop layer 316 is formed on and in contact with the p-type metal gate structure 106p-2 in the PMOS gate region 107p and the polysilicon layer 302 in the NMOS gate region 107n. A second photoresist layer 503 is further formed on the second oxide stop layer 316. The p-type metal gate structure 106p-2 is protected by the second photoresist layer 503 in the subsequent patterning and etching process described below.

At operation 424, the polysilicon layer is patterned and etched to form a complementary pattern trench in the NMOS gate region. In the illustrated example of FIG. 5F, a patterning and etching process is performed on the polysilicon layer 302 in the NMOS gate region 107n to form the complementary pattern trench 318. Consequently, the unconsumed polysilicon layer 302 that remains in the NMOS gate region 107$n$ forms multiple n-type dummy structures 112$n$-2 (i.e., a second example of the n-type dummy structure 112$n$ shown in FIG. 1A) surrounded by the complementary pattern trench 318. The multiple n-type dummy structures 112$n$-2 form an n-type dummy pattern 111$n$-2. However, the p-type metal gate structure 106$p$-2 in the PMOS gate region 107$p$ is protected by the second photoresist layer 503 disposed on the second oxide stop layer 316 and remains unchanged during the patterning and etching process.

Figure 5G:
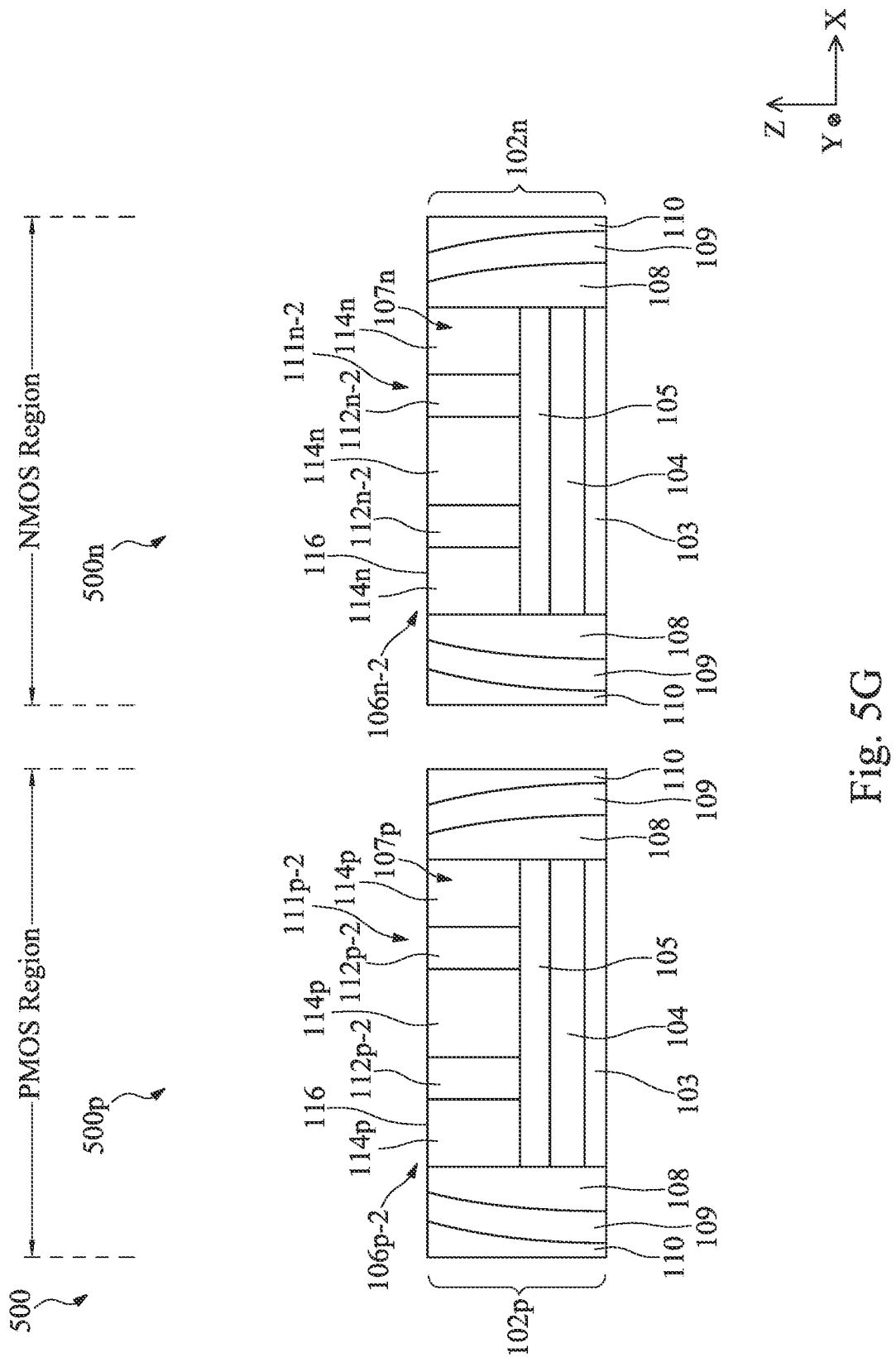

At operation 426, an n-type metal gate layer is formed. As shown in FIGS. 5F-5G, an n-type metal layer is formed in the complementary pattern trench 318 shown in FIG. 5F in the NMOS gate region 107$n$ to form the n-type metal gate layer 114$n$ surrounding the multiple n-type dummy structures 112$n$-2.

At operation 428, a CMP process is performed to remove the excess n-type metal layer. In the illustrated example of FIG. 5G, the CMP process is performed until the multiple n-type dummy structures 112$n$-2 in the NMOS gate region 107$n$ are polished out (i.e., exposed). The second oxide stop layer 316 and the second photoresist layer 503 are also removed by the CMP process. The p-type metal gate layer 114$p$ and the multiple p-type dummy structures 112$p$-2 form the p-type metal gate structure 106$p$-2 in the PMOS gate region 107$p$, and the n-type metal gate layer 114$n$ and the multiple n-type dummy structures 112$n$-2 form the n-type metal gate structure 106$n$-2 in the NMOS gate region 107$n$.

In the example shown in FIGS. 5F-5G, before the CMP process is performed, the n-type metal gate layer 114$n$ comprises a second metal, each of the n-type dummy structures 112$n$-2 comprises polysilicon, and the second oxide stop layer 316 comprises silicon oxide. It is noted that the CMP process can have selectivity between the second metal of the n-type metal gate layer 114$n$ and the polysilicon of the n-type dummy structures 112$n$-2, due to their different resistivities or polishing rates against the chemicals used in the CMP process. For similar reasons, the CMP process can also have selectivity between the second metal of the n-type metal gate layer 114$n$ and the silicon oxide of the second oxide stop layer 316. Because of the CMP selectivity, the CMP dishing effect can be mitigated or minimized, and a flat or substantially flat top surface 116 can be achieved after the CMP process.

Example Oxide Dummy Structures

FIG. 6 is a flowchart diagram illustrating an example method 600 of fabricating a semiconductor structure in accordance with some embodiments. FIGS. 7A-7G are schematic diagrams illustrating cross-sectional views of a semiconductor structure 700 at various fabrication stages in accordance with some embodiments. The semiconductor structure 700 is a close variation of the semiconductor structure 500 shown in FIGS. 5A-5G.

Figure 7A:
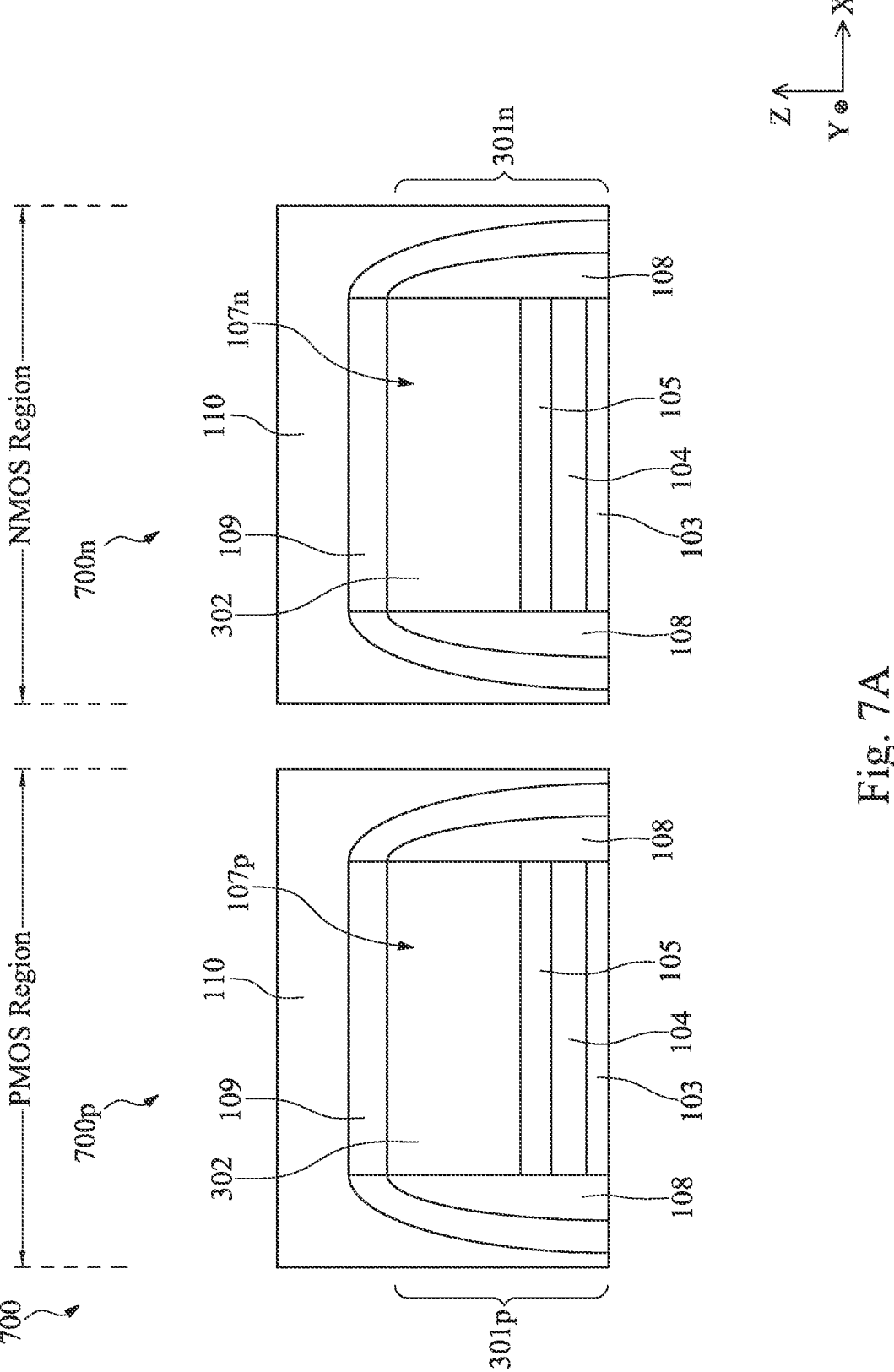
Figure 7B:
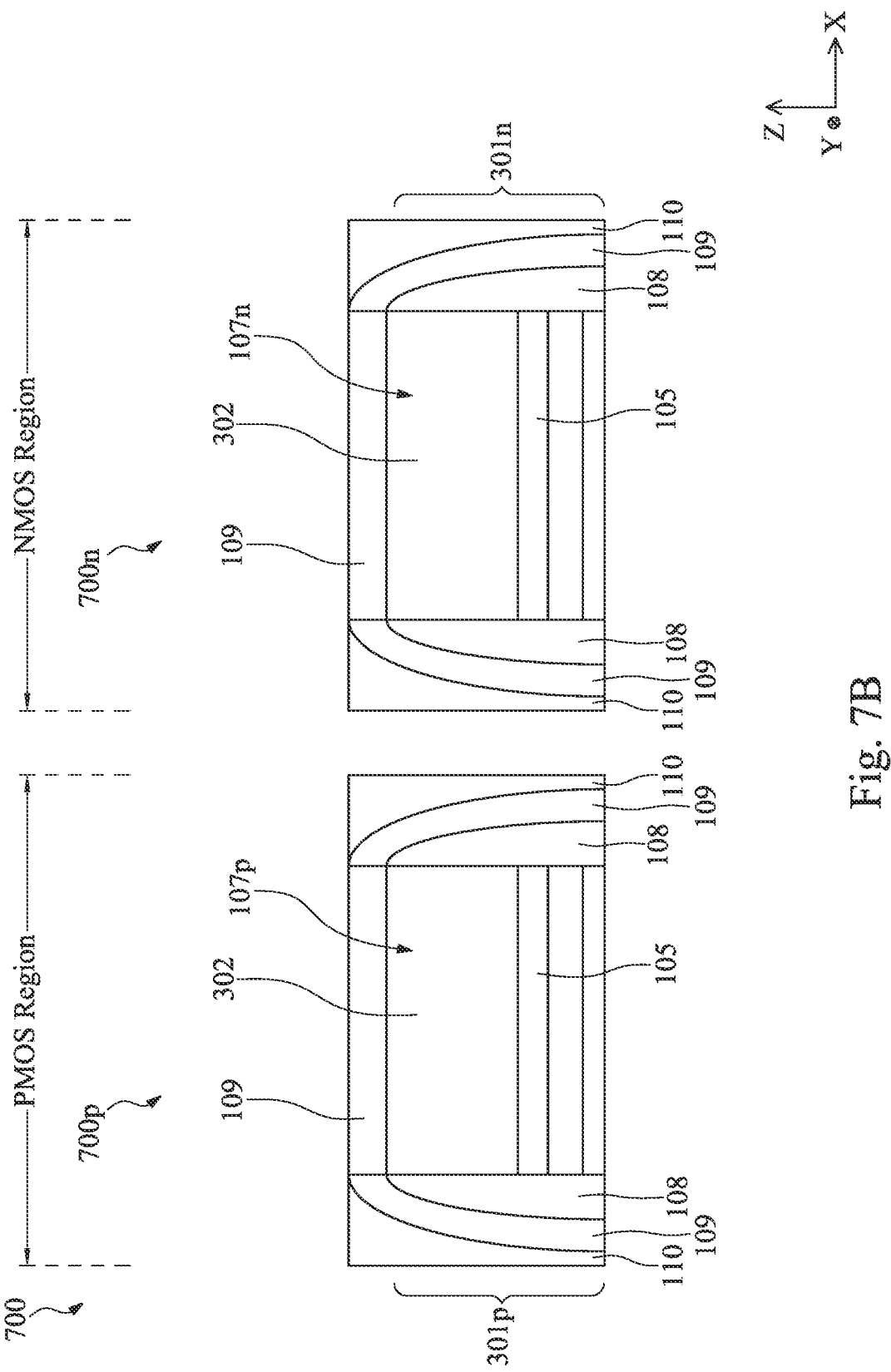

In the illustrated example of FIG. 6, the method 600 includes operations 602, 604, 606, 608, 610, 612, 614, 616, 618, 620, 622, 624, 626, 628, 630, 632, and 634. It is noted that operations 602, 604, 608, 610, and 612 are identical or similar to the operations 402, 404, 406, 408, 410, and 412 of the method 400 shown in FIG. 4, and therefore will not be repeated unless otherwise indicated. Accordingly, the semiconductor structure 700 shown in FIGS. 7A-7B is identical or similar to the semiconductor structure 500 shown in FIGS. 5A-5B.

At operation 614, the polysilicon layer is patterned and etched to form dummy pattern openings in both the PMOS gate region and the NMOS gate region. Each of the dummy pattern openings extends vertically through an entire thickness of the polysilicon layer.

At operation 616, a dummy layer is formed. In one embodiment, the dummy layer is a dummy oxide layer comprising silicon oxide or other suitable oxide materials. It should be noted that the dummy oxide layer is not intended to be limiting, and other dummy layers comprising different materials such as silicon nitride or a dielectric material are also possible in alternative embodiments. In some embodiments, the dielectric material can be a high-κ dielectric material such as the examples provided in Table 1.

Figure 7C:
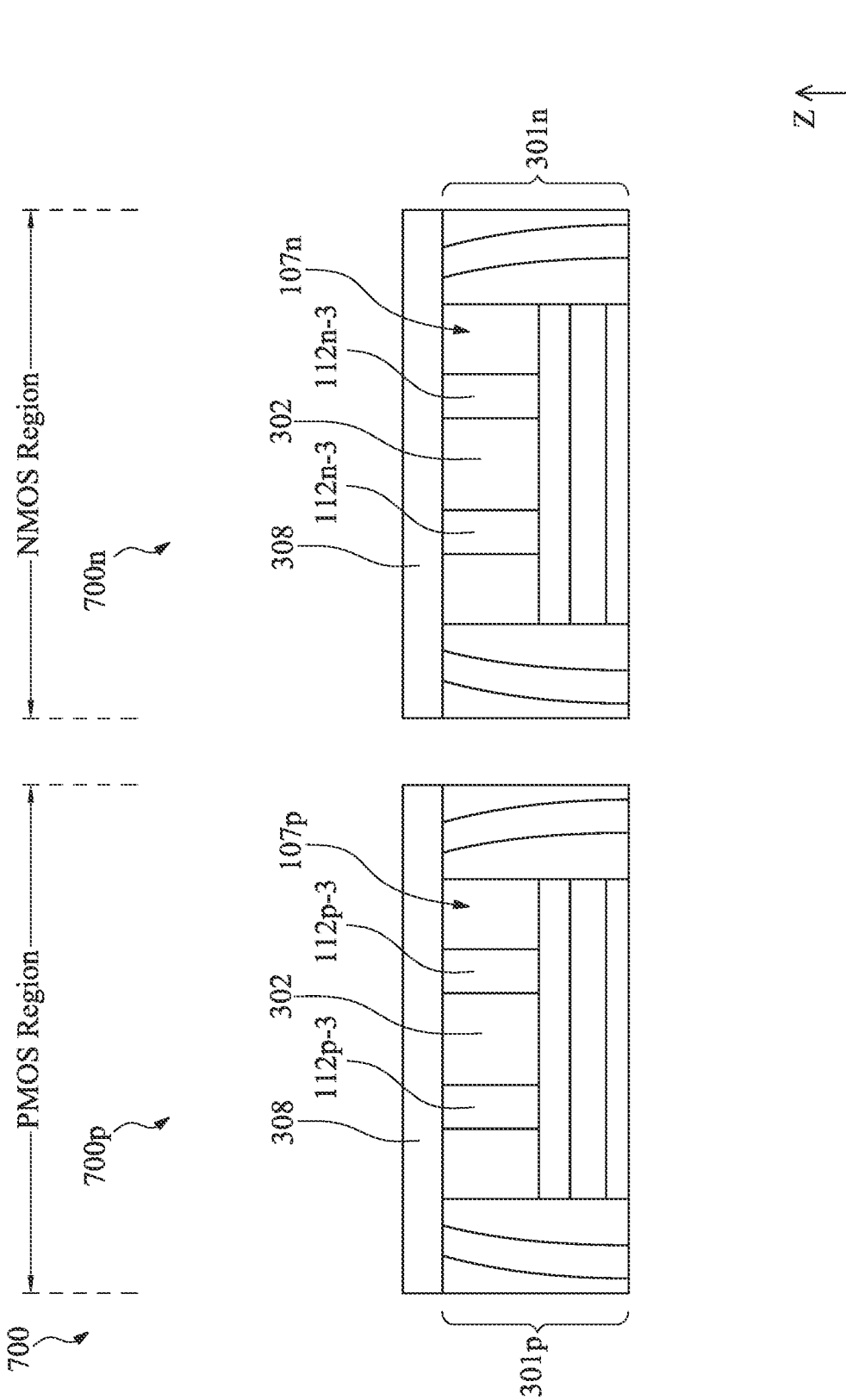

In the illustrated example of FIG. 7C, the dummy layer fills in the multiple dummy pattern openings to simultaneously form multiple p-type dummy structures 112$p$-3 (i.e., a third example of the p-type dummy structure 112$p$ shown in FIG. 1A) in the PMOS gate region 107$p$ and multiple n-type dummy structures 112$n$-3 (i.e., a third example of the n-type dummy structure 112$n$ shown in FIG. 1A) in the NMOS gate region 107$n$. In some embodiments, each of the multiple p-type dummy structures 112$p$-3 and multiple n-type dummy structures 112$n$-3 comprises silicon oxide. In other embodiments, each of the multiple p-type dummy structures 112$p$-3 and multiple n-type dummy structures 112$n$-3 comprises silicon nitride, high-κ dielectric, or other dielectric materials, as mentioned above. The multiple p-type dummy structures 112$p$-3 form a p-type dummy pattern 111$p$-3, and the multiple n-type dummy structures 112$n$-3 form an n-type dummy pattern 111$n$-3.

At operation 618, a CMP process is performed to remove the excess dummy oxide layer and expose the polysilicon layer.

At operation 620, a first oxide stop layer is formed. In the illustrated example of FIG. 7C, the first oxide stop layer 308 is formed in both the PMOS region and the NMOS region. The first oxide stop layer 308 covers the polysilicon layer 302, the multiple p-type dummy structures 112$p$-3, and the multiple n-type dummy structures 112$n$-3.

At operation 622, the polysilicon layer is patterned and etched to form a complementary pattern trench in the PMOS gate region. In some embodiments, a first photoresist is formed on the first oxide stop layer. In the illustrated example of FIG. 7D, a patterning and etching process is performed on the polysilicon layer 302 to form the complementary pattern trench 312 in the PMOS gate region 107$p$. A first photoresist layer 502 is formed on the first oxide stop layer 308. However, the multiple p-type dummy structures 112$p$-3 are kept unchanged and remain in the PMOS gate region 107$p$ during the patterning and etching process. On the other hand, the polysilicon layer 302 and the multiple n-type dummy structures 112$n$-3 in the NMOS gate region 107$n$ are protected by the first photoresist layer 502 disposed on the first oxide stop layer 308 and remain unchanged during the patterning and etching process.

At operation 624, a p-type metal gate layer is formed. In the example shown in FIG. 7E, a p-type metal layer is formed in the complementary pattern trench 312 shown in FIG. 7D in the PMOS gate region 107$p$ to form the p-type metal gate layer 114$p$. The p-type metal gate layer 114$p$ and the multiple p-type dummy structures 112$p$-3 form the p-type metal gate structure 106$p$-3.

At operation 626, a CMP process is performed to remove the excess p-type metal layer. In the illustrated example of FIG. 7E, the CMP process is performed until the p-type dummy structures 112$p$-3 in the PMOS gate region 107$p$ and the polysilicon layer 302 in the NMOS gate region 107$n$ are polished out (i.e., exposed). The first oxide stop layer 308 is removed by the CMP process.

In the example shown in FIGS. 7D-7E, before the CMP process is performed, the p-type metal gate layer 114p comprises a first metal, each of the multiple p-type dummy structures 112p-3 comprises silicon oxide, and the first oxide stop layer 308 also comprises silicon oxide. As mentioned above, the CMP process can have selectivity between the first metal of the p-type metal gate layer 114p and the silicon oxide of the multiple p-type dummy structures 112p-3, due to their different resistivities or polishing rates against the chemicals used in the CMP process. For similar reasons, the CMP process can also have selectivity between the first metal of the p-type metal gate layer 114p and the silicon oxide of the first oxide stop layer 308. Because of the CMP selectivity, the CMP dishing effect can be mitigated or minimized, and a flat or substantially flat top surface of the p-type metal gate structure 106p-3 can be achieved after the CMP process.

At operation 628, a second oxide stop layer is formed. In the illustrated example of FIG. 7E, the second oxide stop layer 316 is formed in both the PMOS region and the NMOS region. The second oxide stop layer 316 covers the polysilicon layer 302, the multiple p-type dummy structures 112p-3, and the multiple n-type dummy structures 112n-3.

At operation 630, the polysilicon layer is patterned and etched to form a complementary pattern trench in the NMOS gate region. In some embodiments, a second photoresist is formed on the second oxide stop layer. In the illustrated example of FIG. 7F, a patterning and etching process is performed on the polysilicon layer 302 in the NMOS gate region 107n to form the complementary pattern trench 318. A second photoresist layer 503 is formed on the second oxide stop layer 316 to protect the p-type metal gate structure 106p-3 in the subsequent patterning and etching process described below. The multiple n-type dummy structures 112n-3 are kept unchanged and remain in the NMOS gate region 107n during the patterning and etching process. On the other hand, the p-type metal gate structure 106p-3 in the PMOS gate region 107p is protected by the second photoresist layer 503 disposed on the second oxide stop layer 316 and remains unchanged during the patterning and etching process.

At operation 632, an n-type metal gate layer is formed. In the example shown in FIG. 7G, an n-type metal layer is formed in the complementary pattern trench 318 shown in FIG. 7G to form the n-type metal gate layer 114n in the NMOS gate region 107n. The n-type metal gate layer 114n and the multiple n-type dummy structures 112n-3 form the n-type metal gate structure 106n-3.

At operation 634, a CMP process is performed to remove the excess n-type metal layer. In the illustrated example of FIG. 7G, the CMP process is performed until the n-type dummy structures 112n-3 in the NMOS gate region 107n are polished out (i.e., exposed). The second oxide stop layer 316 is also removed by the CMP process.

Figure 7G:
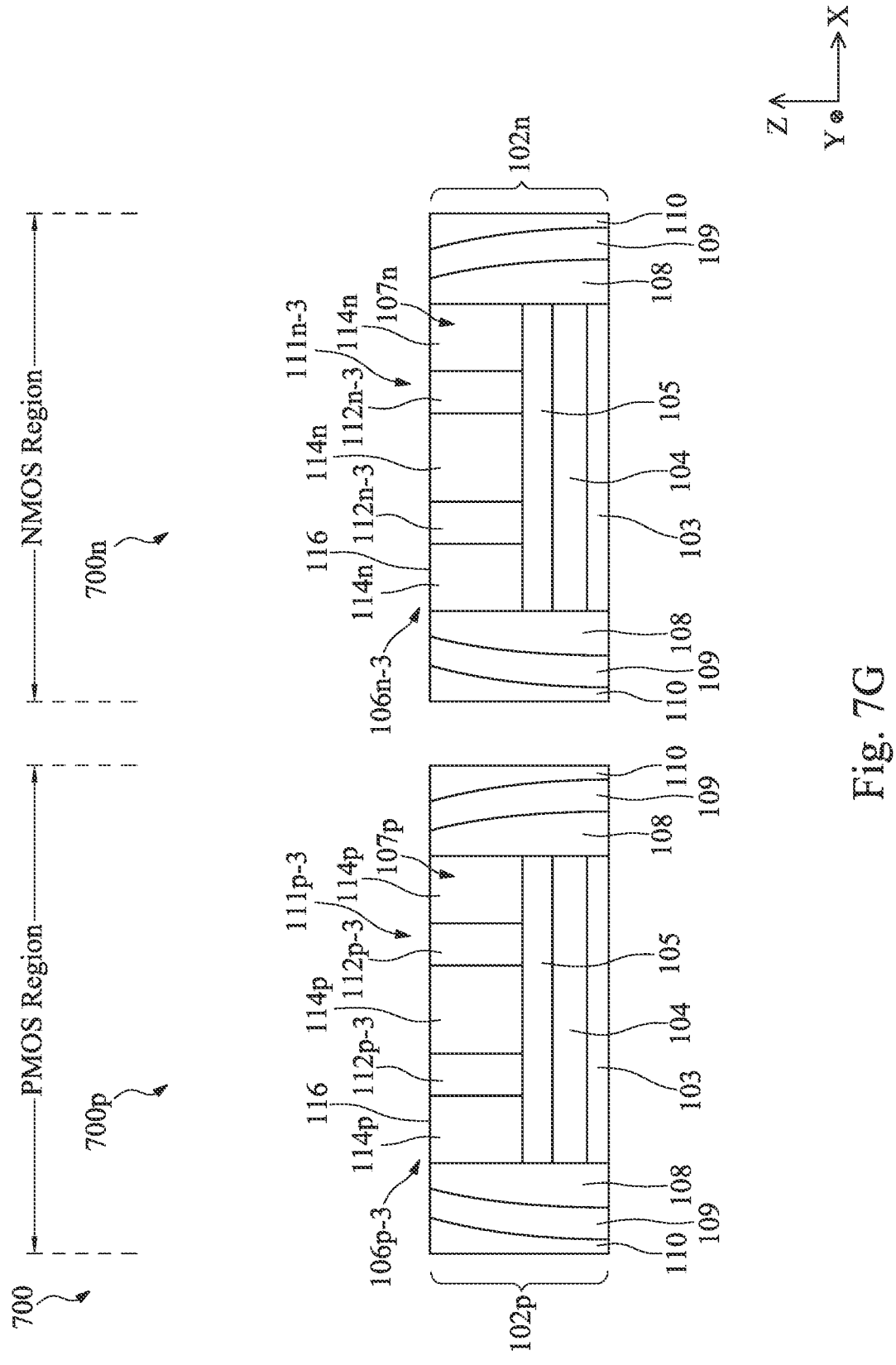

In the example shown in FIGS. 7F-7G, before the CMP process is performed, the n-type metal gate layer 114n comprises a second metal, each of the multiple n-type dummy structures 112n-3 comprises silicon oxide, and the second oxide stop layer 316 also comprises silicon oxide. As mentioned above, the CMP process can have selectivity between the second metal of the n-type metal gate layer 114n and the silicon oxide of the multiple n-type dummy structures 112n-3, due to their different resistivities or polishing rates against the chemicals used in the CMP process. For similar reasons, the CMP process can also have selectivity between the second metal of the n-type metal gate layer 114n and the silicon oxide of the second oxide stop layer 316. Because of the CMP selectivity, the CMP dishing effect can be mitigated or minimized, and a flat or substantially flat top surface of the n-type metal gate structure 106n-3 can be achieved after the CMP process.

Example Dummy Patterns

FIGS. 8A-8H are schematic diagrams illustrating layout views of various examples of a semiconductor structure including a dummy pattern according to some embodiments. It is noted that the semiconductor structures illustrated in FIGS. 8A-8H are variations of the semiconductor structure 100 shown in FIGS. 1A and 1B. The dummy pattern shown in FIGS. 8A-8H may resemble either the p-type dummy pattern 111p or the n-type dummy pattern 111n shown in FIG. 1B.

Figure 8A:
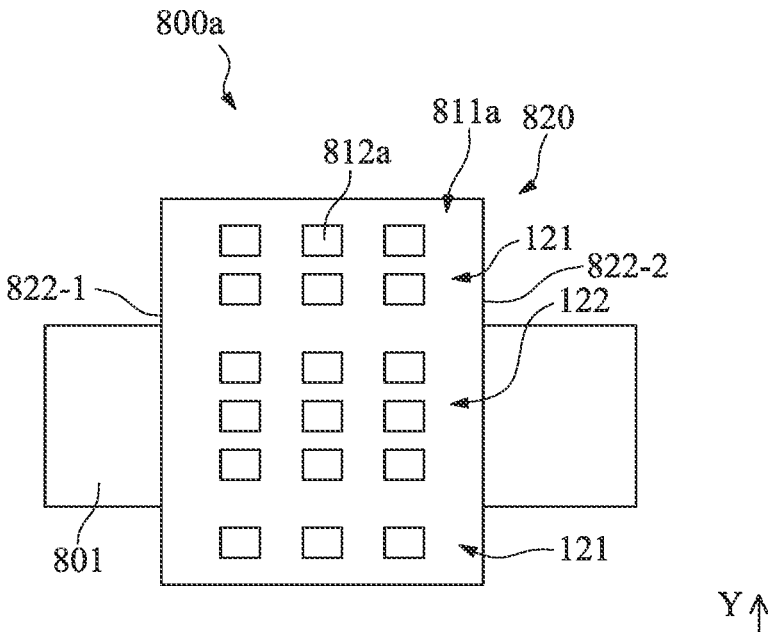

In the illustrated example of FIG. 8A, a semiconductor structure 800a includes a gate feature 820 laid over an active region 801 in the Z-direction and overlaps with the active region 801 in the X-Y plane. The dummy pattern 811a is located in a center area of the gate feature 820 (i.e., a central area between a first edge 822-1 to a second edge 822-2 of the gate feature 820 in the X-direction). The dummy pattern 811a is characterized by an array of dummy structures 812a arranged in rows and columns in the X-Y plane. The dummy pattern 811a is arranged to have a larger number of dummy structures 812a in the gate region 122 than in the two end regions 121. Additionally, the numbers of the dummy structures 812a in the two end regions 121 can be different. Each of the dummy structures 812a has a square or rectangular shape in the X-Y plane, although other shapes are also possible in alternative embodiments. It is noted that the unit size, unit shape, and arrangement of the dummy structures 812a can vary depending on design requirements.

Figure 8B:
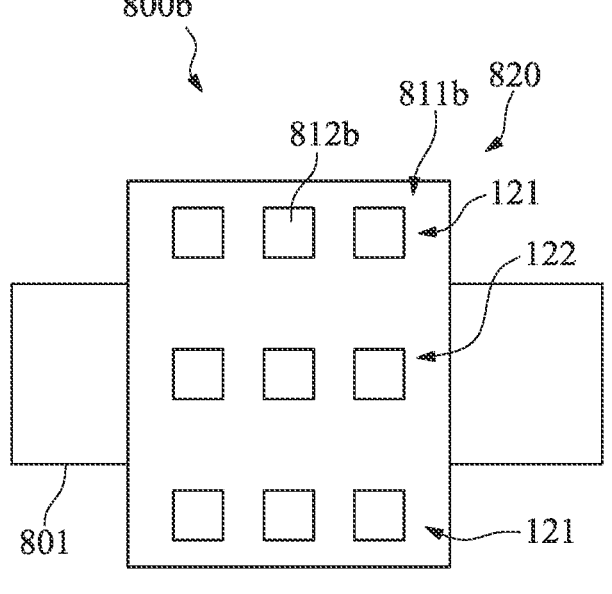

In the illustrated example of FIG. 8B, the dummy pattern 811b has a smaller number of dummy structures 812b as compared to the dummy pattern 811a shown in FIG. 8A. In addition, the number of dummy structures 812b in the gate region 122 is the same as the number of dummy structures 812b in each of the two end regions 121. Each of the dummy structures 812b also has a larger unit size (i.e., a larger width and a larger length) as compared with the dummy structure 812a shown in FIG. 8A.

Figure 8C:
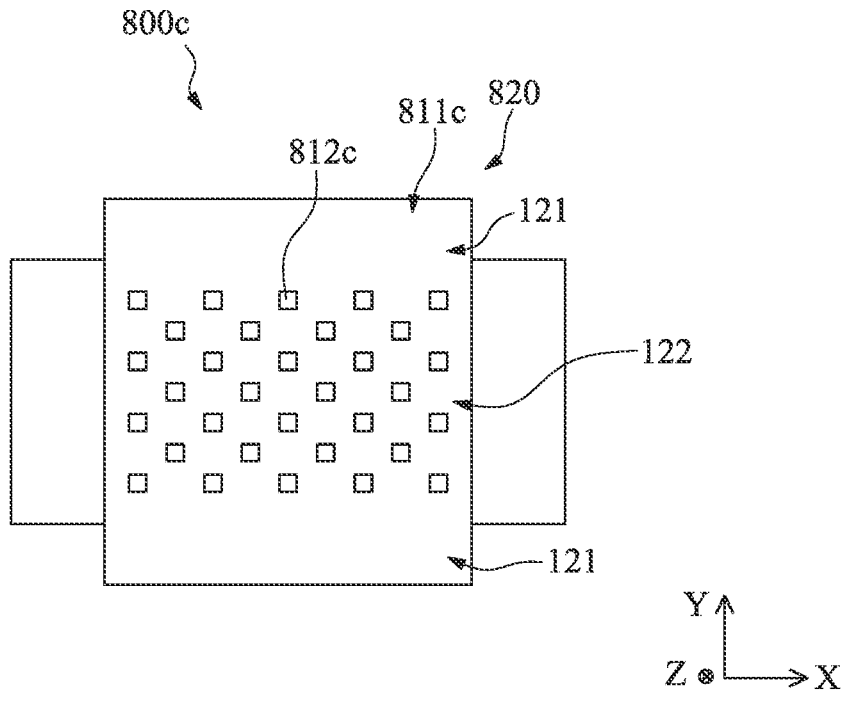

In the illustrated example of FIG. 8C, multiple dummy structures 812c are arranged in a zig-zag pattern in the gate region 122 to form the dummy pattern 811c. Compared to the dummy structures 812a shown in FIG. 8A, each of the dummy structures 812c has a smaller unit size.

Figure 8D:
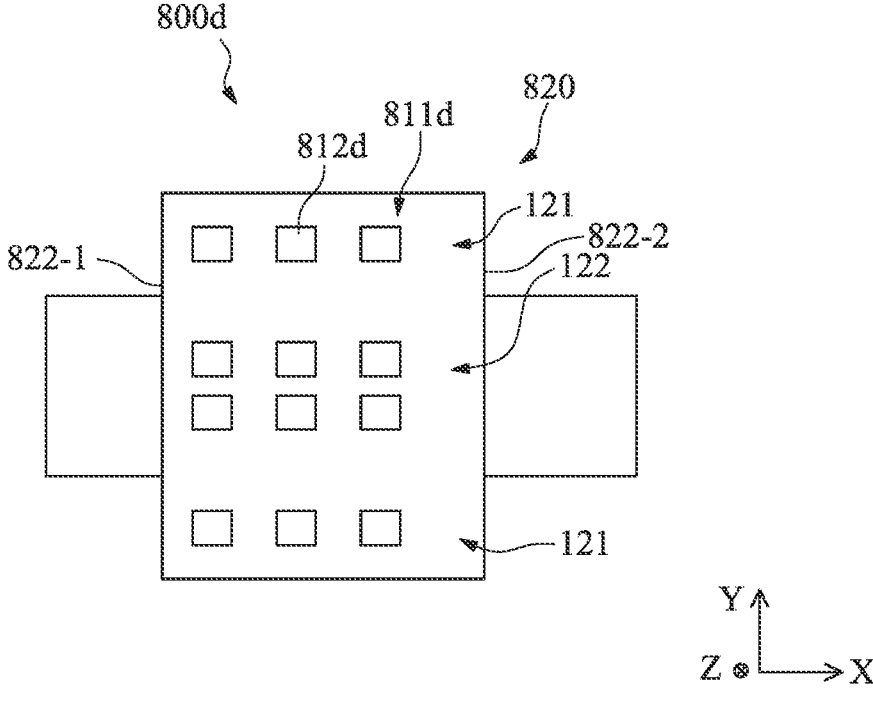

In the illustrated example of FIG. 8D, the dummy pattern 811d is not centered between the first edge 822-1 and the second edge 822-2 of the gate feature 820. Rather, the dummy pattern 811d is arranged to be closer to one edge and farther away from the other edge. It is noted that the location of the dummy pattern 811d in the gate feature 820 can be adjusted depending on design requirements.

Figure 8E:
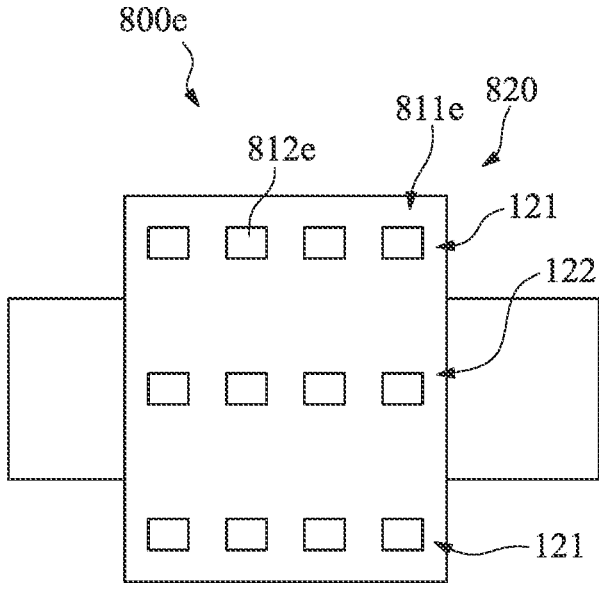

In the illustrated example of FIG. 8E, the dummy pattern 811e has a larger number of dummy structures 812e per unit area of the gate feature 820 (i.e., a higher density of dummy structure 812e), as compared with the dummy pattern 811b shown in FIG. 8B.

Figure 8F:
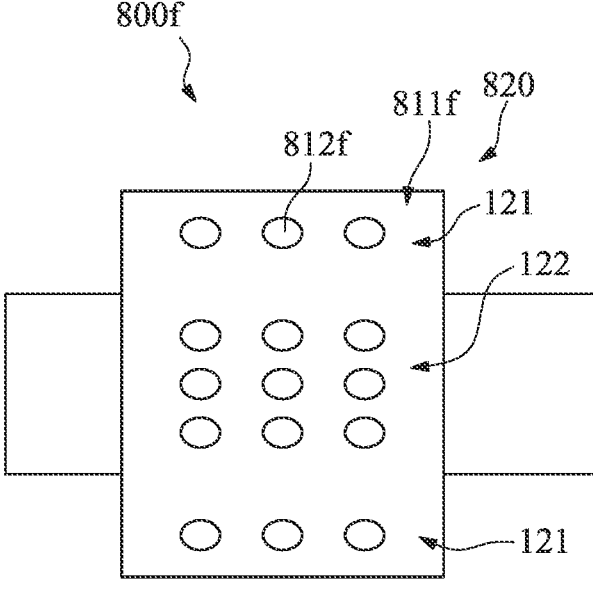

In the illustrated example of FIG. 8F, the dummy structures 812f of the dummy pattern 811f have a circular shape in the X-Y plane.

In the illustrated example of FIG. 8G, the dummy pattern 811g has a higher density of dummy structures 812g in the gate region 122 than in the two end regions 121.

In the illustrated example of FIG. 8H, the dummy pattern 811*h* is located in the gate region 122 of the gate feature 820, and no dummy structure is located in the two end regions 121 of the gate structure 802.

It should be understood that the dummy patterns shown in FIGS. 8A-8H are exemplary rather than limiting, and other dummy patterns are also within the contemplated scope of disclosure.

Example Method for Inserting a Dummy Pattern

Figure 9:
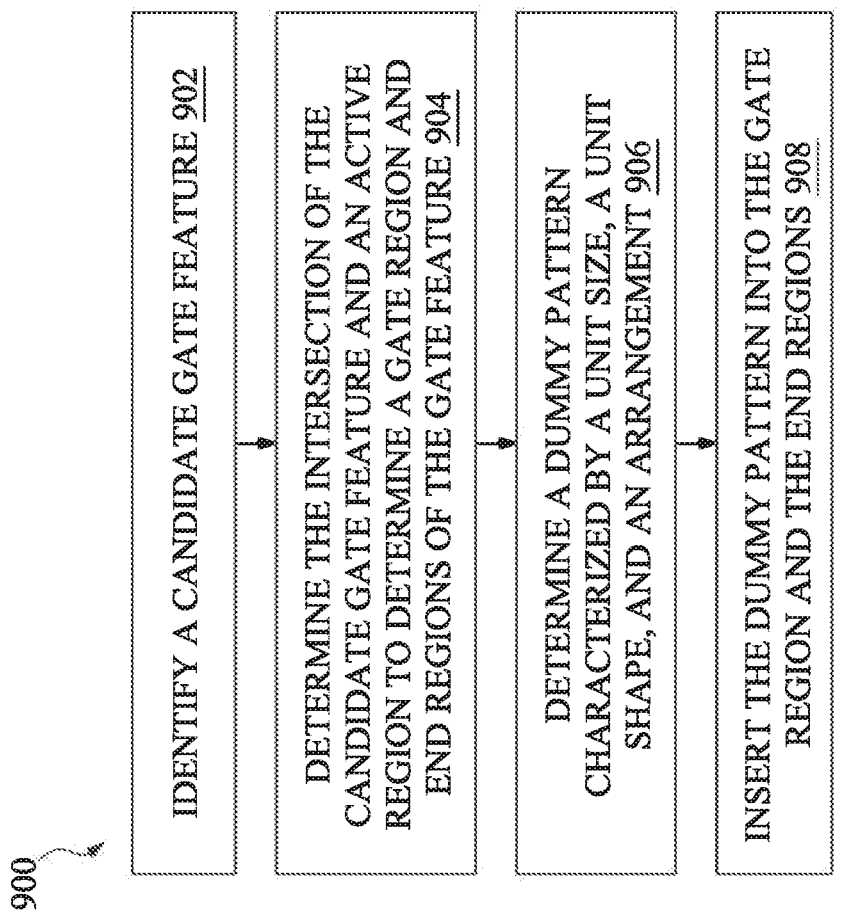
FIG. 9 is a flowchart diagram illustrating an example method in accordance with some embodiments.
Figure 10:
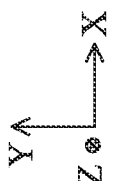
FIG. 10 is a schematic diagram illustrating a layout view of one example semiconductor structure including a dummy pattern in accordance with some embodiments.

FIG. 9 is a flowchart diagram illustrating an example method 900 for inserting a dummy pattern in a gate feature in accordance with some embodiments. FIG. 10 is a schematic diagram illustrating an example layout 1000 including a dummy pattern 111 according to some embodiments. It is noted that the dummy pattern 111 shown in FIG. 10 may resemble either the p-type dummy pattern 111-*p* or the n-type dummy pattern 111-*n* shown in FIG. 1B.

In the illustrated example of FIG. 9, the method 900 includes, among other things, operations 902, 904, 906, and 908. At operation 902, a candidate gate feature is identified. In the example shown in FIG. 10, the candidate gate feature 120 may be a p-type gate feature or an n-type gate feature. In some embodiments, the candidate gate feature 120 has a square or rectangular shape extending from a first gate feature side 1022 to a second gate feature side 1024 in the Y-direction shown in FIG. 10. In some embodiments, the candidate gate feature 120 has a total area in a range from 3 μm² to 225 μm².

At operation 904, an intersection of the candidate gate feature and an active region is determined to further determine a gate region and end regions of the gate feature. In the example shown in FIG. 10, the candidate gate feature 120 is laid over an active region 101 (e.g., a p-type active region 101-*p* or an n-type active region 101-*n* shown in FIG. 1B) and intersects with the active region 101 in the X-Y plane. The active region 101 extends in the X-direction. The active region 101 is also characterized by a first active region side 1012 and a second active region side 1014. An intersection area 1026 of the candidate gate feature 1020 is determined as the overlaid area between the first active region side 1012 and the second active region side 1014 of the active region 101. The gate region 122 of the candidate gate feature 120 is within the intersection area 1026. The two end regions 121 of the candidate gate feature 120 are within the area between the first gate feature side 1022 and the first active region side 1012 and the area between the second gate feature side 1024 and the second active region side 1014, respectively. As shown in FIG. 10, the candidate gate feature 120 further includes two buffer margins 1032 respectively between each of the two end regions 121 and the gate region 122. Each of the buffer margins 1032 is aligned with and centered around the first active region side 1012 and the second active region side 1014, respectively. In some embodiments, each of the buffer margins 1032 has a dimension (F) in the Y-direction, and the dimension (F) is equal to or greater than 0.02 μm.

At operation 906, a dummy pattern characterized by a unit size, a unit shape, and an arrangement of multiple dummy structures is determined Examples of the dummy pattern and dummy structures include those described with references to FIGS. 8A-8G. In the illustrated example of FIG. 10, the dummy pattern 111 includes multiple dummy structures 112 (e.g., the p-type dummy structures 112-*p* or the n-type dummy structures 112-*n* shown in FIG. 1B). Each dummy structure 112 has a length (L) in the X-direction and a width (W) in the Y-direction. In some embodiments, each of the length (L) and width (W) of the dummy structure 112 is equal to or greater than 0.114 μm. In some embodiments, a distance (S) between the two adjacent dummy structures 112 in the X-direction is equal to or greater than 0.114 μm.

At operation 908, the dummy pattern is inserted into the gate region and the end regions. As such, the example layout 1000, which includes the dummy pattern 111, is generated. The example layout 1000 can be used to fabricate the semiconductor structure 100 shown in FIG. 1A.

SUMMARY

In accordance with some aspects of the disclosure, a semiconductor structure is provided. The semiconductor structure includes: an active region; and a gate stack disposed on the active region. The gate stack includes: at least one gate dielectric layer disposed on the active region; and a metal gate structure disposed on the at least one gate dielectric layer. The metal gate structure includes: a metal gate layer comprising a first material; and at least one dummy structure disposed in the metal gate layer, the at least one dummy structure extending vertically through an entire thickness of the metal gate structure and comprising a second material. The second material is different from the first material.

In accordance with some aspects of the disclosure, a semiconductor structure having a p-type metal-oxide-semiconductor (PMOS) region and an n-type metal-oxide-semiconductor (NMOS) region is provided. The semiconductor structure includes: a p-type semiconductor structure and an n-type semiconductor structure. The p-type semiconductor structure includes: a p-type active region in the PMOS region; and a p-type gate stack including: at least one gate dielectric layer disposed on the p-type active region; and a p-type metal gate structure disposed on the at least one gate dielectric layer. The p-type metal gate structure includes: a p-type metal gate layer comprising a first material; and at least one p-type dummy structure disposed in the p-type metal gate layer, the at least one p-type dummy structure extending vertically through an entire thickness of the p-type metal gate structure and comprising a second material, wherein the second material is different from the first material. The n-type semiconductor structure includes: an n-type active region in the NMOS region; and an n-type gate stack including: at least one gate dielectric layer disposed on the n-type active region; and an n-type metal gate structure disposed on the at least one gate dielectric layer. The n-type metal gate structure includes: an n-type metal gate layer comprising a third material; and at least one n-type dummy structure disposed in the n-type metal gate layer, the at least one n-type dummy structure extending vertically through an entire thickness of the n-type metal gate structure and comprising a fourth material, wherein the third material is different from the fourth material.

In accordance with some aspects of the disclosure, a method for fabricating a semiconductor structure is provided. The method includes: forming a gate stack, the gate stack comprising: at least one gate dielectric layer; and a polysilicon layer disposed on the at least on gate dielectric layer; forming a first oxide stop layer on the gate stack; patterning and etching the polysilicon layer to form at least one n-type dummy pattern opening in an n-type metal-oxide-semiconductor (NMOS) gate region and a p-type complementary p-type pattern trench in a p-type metal-oxide-semiconductor (PMOS) gate region; forming a p-type metal gate layer in the p-type complementary pattern trench and at least one n-type dummy structure in the at least one n-type dummy pattern opening; performing a first CMP process; forming a second oxide stop layer on the gate stack;

patterning and etching the polysilicon layer to form at least one p-type dummy pattern opening in the PMOS gate region and an n-type complementary pattern trench in the NMOS gate region; forming an n-type metal gate layer in the n-type complementary pattern trench and at least one p-type dummy structure in the at least one p-type dummy pattern opening; and performing a second CMP process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an active region; and
a gate stack disposed on the active region, the gate stack comprising:
   at least one gate dielectric layer disposed on the active region; and
   a metal gate structure disposed on the at least one gate dielectric layer, the metal gate structure comprising:
   a metal gate layer comprising a first material; and
   at least one dummy structure surrounded by the metal gate layer, the at least one dummy structure extending vertically through an entire thickness of the metal gate structure and comprising a second material, wherein the second material is different from the first material.

2. The semiconductor structure of claim 1, wherein the metal gate structure is of a first semiconductor conductivity type.

3. The semiconductor structure of claim 1, wherein the metal gate structure is of a second semiconductor conductivity type.

4. The semiconductor structure of claim 1, wherein the metal gate structure comprises a plurality of the dummy structures, the plurality of the dummy structures forming a dummy pattern.

5. The semiconductor structure of claim 4, wherein the dummy structures are arranged in rows and columns in a horizontal plane.

6. The semiconductor structure of claim 1, wherein the first material is a first metal.

7. The semiconductor structure of claim 6, wherein the second material is a second metal, wherein the second metal is different from the first metal.

8. The semiconductor structure of claim 1, wherein the second material is polysilicon.

9. The semiconductor structure of claim 1, wherein the second material is silicon oxide.

10. The semiconductor structure of claim 1, wherein the second material is silicon nitride or a dielectric material.

11. The semiconductor structure of claim 1, wherein the metal gate structure has a uniform gate thickness.

12. The semiconductor structure of claim 1, further comprising two sidewall spacers respectively disposed on two sidewalls of the gate stack.

13. A method comprising:
forming an active region; and
forming a gate stack on the active region, the gate stack comprising:
   at least one gate dielectric layer disposed on the active region; and
   a metal gate structure disposed on the at least one gate dielectric layer, the metal gate structure comprising:
   a metal gate layer comprising a first material; and
   at least one dummy structure surrounded by the metal gate layer, the at least one dummy structure extending vertically through an entire thickness of the metal gate structure and comprising a second material, wherein the second material is different from the first material.

14. The method of claim 13, wherein the metal gate structure is of a first semiconductor conductivity type.

15. The method of claim 13, wherein the metal gate structure is of a second semiconductor conductivity type.

16. The method of claim 13, wherein the metal gate structure comprises a plurality of the dummy structures, the plurality of the dummy structures forming a dummy pattern.

17. The method of claim 16, wherein the dummy structures are arranged in rows and columns in a horizontal plane.

18. A field-effect transistor (FET) comprising:
a semiconductor substrate having an active region, the active region including a source region and a drain region separated by a channel region; and
a gate stack disposed over the channel region, the gate stack comprising:
   at least one gate dielectric layer disposed on the active region; and
   a metal gate structure disposed on the at least one gate dielectric layer, the metal gate structure comprising:
   a metal gate layer comprising a first material; and
   a plurality of dummy structures surrounded by the metal gate layer, the plurality of dummy structures forming a dummy pattern and extending vertically through an entire thickness of the metal gate electrode, wherein the dummy structures comprise a second material that is different from the first material.

19. The FET of claim 18, wherein the FET is a p-type metal-oxide-semiconductor (PMOS) device.

20. The FET of claim 18, wherein the FET is an n-type metal-oxide-semiconductor (NMOS) device.

* * * * *